United States Patent [19]

Lubow et al.

[11] Patent Number: 5,801,406
[45] Date of Patent: Sep. 1, 1998

[54] VARIABLE SIZE INTEGRATED CIRCUIT, MASK PROGRAMMABLE GATE ARRAY

[75] Inventors: Ray N. Lubow; Kashmira Singh Johal, both of San Jose, Calif.

[73] Assignee: Asic Technical Solutions, San Jose, Calif.

[21] Appl. No.: 496,037

[22] Filed: Jun. 28, 1995

Related U.S. Application Data

[63] Continuation of Ser. No. 183,691, Jan. 18, 1994, abandoned.
[51] Int. Cl.$^6$ ............................................. H01L 27/10
[52] U.S. Cl. ............................ 257/202; 257/208; 257/210
[58] Field of Search ................................ 257/309, 202, 257/203, 208, 210

[56] References Cited

U.S. PATENT DOCUMENTS 4,006,492  2/1977  Eichelberger et al. ............... 257/923
4,467,400  8/1984  Stopper ................................. 257/923
5,300,796  4/1994  Shintani ................................. 257/202

Primary Examiner—Jerome Jackson
Assistant Examiner—Nathan K. Kelly
Attorney, Agent, or Firm—Lyon & Lyon LLP

[57] ABSTRACT

A mask programmable integrated circuit having a plurality of iterative building blocks. Each building block has at least two adjacent basic base arrays. Each base array is comprised of an array of sites which, after personalization, form an array of logic blocks. Fabricated between the basic arrays is bridging circuitry. The generic layers of bridging circuitry are comprised of an array of sites. In order to fabricate the customized integrated circuit, personalization layers are fabricated over the generic layers. The personalization layers are arranged such that a particular integrated circuit design can utilize as many basic arrays as necessary to implement the desired logic functionality. After personalization, the bridging circuitry is comprised of logic blocks and interconnect.

16 Claims, 21 Drawing Sheets

VARIABLE SIZE INTEGRATED CIRCUIT, MASK PROGRAMMABLE GATE ARRAY

This is a continuation of application Ser. No. 08/183,691 filed on Jan. 18, 1994, now abandoned.

BACKGROUND OF THE INVENTION

1. Field of the Invention.

The present invention pertains to the field of semiconductor fabrication and integrated circuits and more particularly pertains to application specific integrated circuits having several different die sizes on a single wafer and methods for fabricating them.

2. Prior Art.

Users of integrated circuits have typically used three different types of technologies to implement logic functions. The first are individual standard logic integrated circuits, such as TTL glue logic. The second are user programmable technologies such as programmable logic arrays ("PLAs") and field programmable gate arrays ("FPGAs"). The third are the use of application specific integrated circuits ("ASICs"). Each type has advantages and disadvantages. Glue logic offers a wide variety of functions at low per chip cost. However, complex functionality can only be achieved with the use of many discrete integrated circuits, thus reducing their cost advantage and increasing the size of the product while reducing reliability. Programmable technologies offer higher gate densities than glue logic and the ability to "customize" the chip for a users particular application. Programmable integrated circuits, however, are expensive. Finally, ASICs offer the ability to implement complex logic functionality. ASICs offer economies of scale when production is large, but, because ASICs are custom designed, they can require substantial non-recurring engineering costs. Thus, the use of ASICs has generally been confined to applications where production runs are high.

One type of ASIC is the customized gate array. As is well known to those skilled in the art, integrated circuits, including customized gate arrays, are fabricated in layers on a wafer. Typically, each layer is formed by first depositing a layer of light sensitive material, e.g., photoresist, on the surface of the wafer. Patterns are then developed in the photoresist by shining a highly collimated light through a "mask", e.g., a glass reticle, incorporating the desired pattern for that particular layer onto the wafer. Generally, because of optical limitations, the mask includes an iterative portion of the wafer pattern for a particular layer. Thus, exposure of the photoresist of the entire wafer is accomplished by stepping the iterative pattern across the wafer.

A typical custom gate array has approximately nine or ten generic layers (generic layers are sometimes referred to as "base layers") and approximately four personalization layers. After all the generic layers have been laid down, an array of "sites" exists on the wafer. Each site contains a collection of circuit elements. In typical custom gate array manufacturing, wafers are fabricated with the generic layers and then set aside until an order for integrated circuits is received. After receipt of the order, the masks for the last four layers are designed and the personalization layers fabricated thereon. The personalization layers generally comprise a first layer metal, a contacts layer, a vias layer, a second layer metal and a passivation layer. These layers interconnect the various sites. The passivation layer is a generic layer, i.e., generally the same for any device.

One of the disadvantages of mask programmable ASICs is that in the prototyping stage of the system design for which the ASIC is being designed, very few ASICs are desired. One reason for this is the fact that the ASIC design may change. Since a wafer is generally capable of producing thousands of integrated circuits, it typically is not economical to produce ASICs in the prototyping stage or for low volume products. Thus, system designers often use FPGAs initially, despite their high unit cost to capitalize on their flexibility. However, because of FPGA's relatively high cost, it would be desirable to use an ASIC when in full production.

Another factor adding to the cost is that ASICs are not all the same size. Some ASICs require low gate counts resulting in a low pin count configurations while other ASICs require a high gate count, resulting in a higher pin count configuration. Since the layers of an integrated circuit are exposed by stepping an iterative cell across the wafer, generally either all the chips on a wafer would be the same size or a preset variety of sizes are employed. In the case where the generic layers form all the same sized integrated circuits, should only a small number of ASICs be need, the remaining chips on the wafer would either have to be discarded or processing would have to wait until orders for the remaining ASICs of that size were received. Similarly, if the generic layers formed a preset size number of various sizes, either the wafer would have to be processed without full utilization of all the resulting integrated circuits, or processing would be delayed until additional orders were received.

Neither alternative is commercially acceptable. The discarding of unused chip locations results in high cost ASICs. Waiting to process the wafer until the ASIC manufacturer receives orders to fill up a wafer results in delay, which is unacceptable when time-to-market is critical, which it typically is in the electronics industry.

Another problem with the fabrication of a preset number of different sizes in the generic layers is determining the proper ratio of one sized integrated circuit to another sized integrated circuit. If the ASIC manufacturer makes the wrong decision, too much wafer real estate per wafer could be wasted, resulting in loss of revenue and increased processing costs.

Accordingly, it is desirable to have a method for processing ASICs that is flexible enough to allow relatively small production runs of ASICs without requiring the expenditure of a large amount of money.

SUMMARY OF THE INVENTION

The present invention overcomes the problems and disadvantages of the prior art through a unique arrangement of integrated circuit components. When the wafers are fabricated, the generic layers form a plurality of iterative building blocks. Each building block is comprised of at least two adjacent basic base arrays. Each base array is comprised of an array of sites which, after personalization, form an array of logic blocks. Fabricated between the basic arrays is bridging circuitry. The generic layers of bridging circuitry is comprised of an array of sites.

In order to fabricate a customized integrated circuit, personalization layers are fabricated over the generic layers. The personalization layers are arranged such that a particular integrated circuit design can utilize as many basic arrays as necessary to implement the desired logic functionality. After personalization, the bridging circuitry is comprised of logic blocks and interconnect.

The above and other preferred features of the invention, including various novel details of construction and combination of components, will now be more particularly described with reference to the accompanying drawings and pointed out in the claims. It will be understood that the particular device embodying the invention are shown by way of illustration only and not as limitations of the invention. As will be understood by those skilled in the art, the principles and features of this invention may be employed in various and numerous embodiments without departing from the scope of the invention.

BRIEF DESCRIPTION OF THE DRAWINGS

Reference is made to the accompanying drawings in which are shown illustrative embodiments of aspects of the invention, from which novel features and advantages will be apparent.

DETAILED DESCRIPTION OF THE DRAWINGS

Referring now to the figures, the presently preferred integrated circuit and method of the present invention will now be described.

Figure 1:
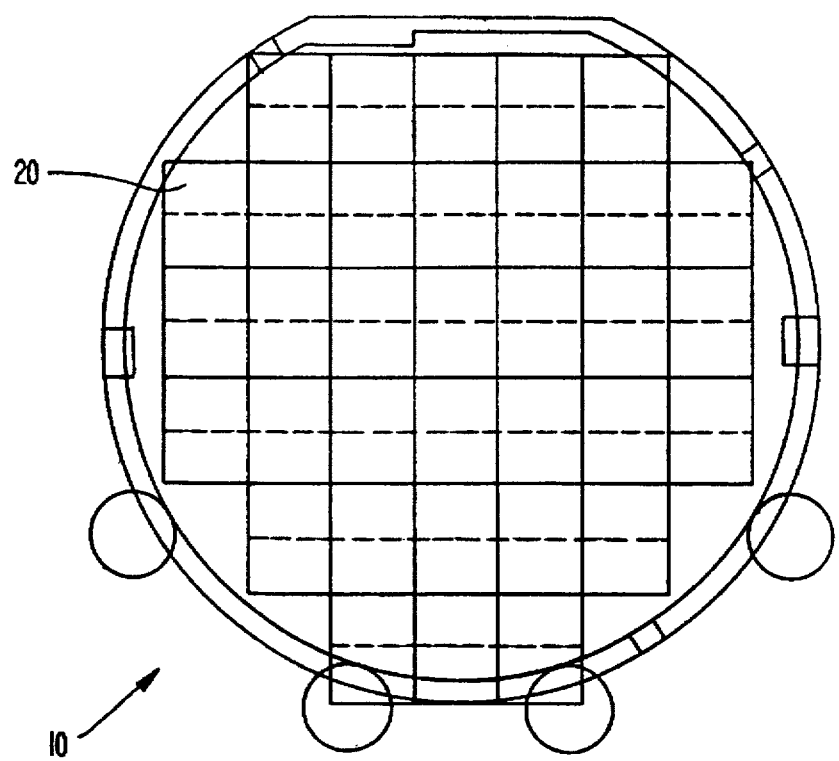
FIG. 1 is a top view of a semiconductor wafer.
Figure 2:
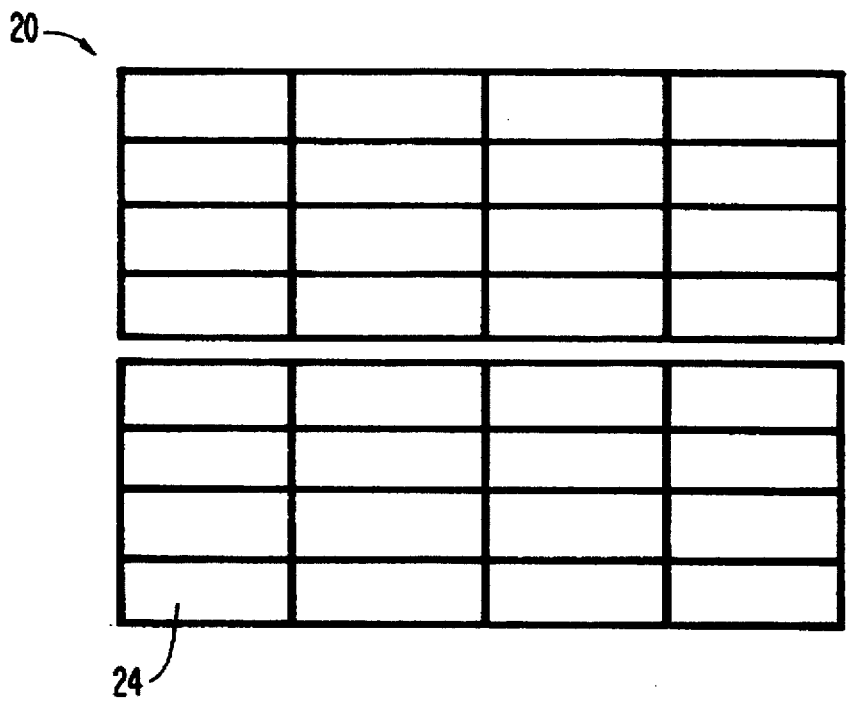
FIG. 2 is a simplified top view of an embodiment of a single frame of the present invention.

With reference to FIG. 1, a wafer 10 is shown. It shows the wafer 10 divided into a number of frames 20. Each frame 20 is an iterative unit and is representative of one step of each layer's reticle (not shown) that is stepped across the wafer 10. In the present invention, each frame 20 is arranged such that a varying number of integrated circuits, each having a variable gate count, can be fabricated from one frame 20. A simple diagram of one frame 20 is shown in FIG. 2. It shows that each frame 20 is divided into a number of base arrays 24. In the embodiment shown in FIG. 2, each frame 20 has a total of thirty-two base arrays 24. However, the present invention contemplates the use of both fewer and greater numbers of base arrays within a single frame 20. Each wafer 10 comprises an array of frames 20 and each frame 20 comprises an array of base arrays 24.

Figure 3:
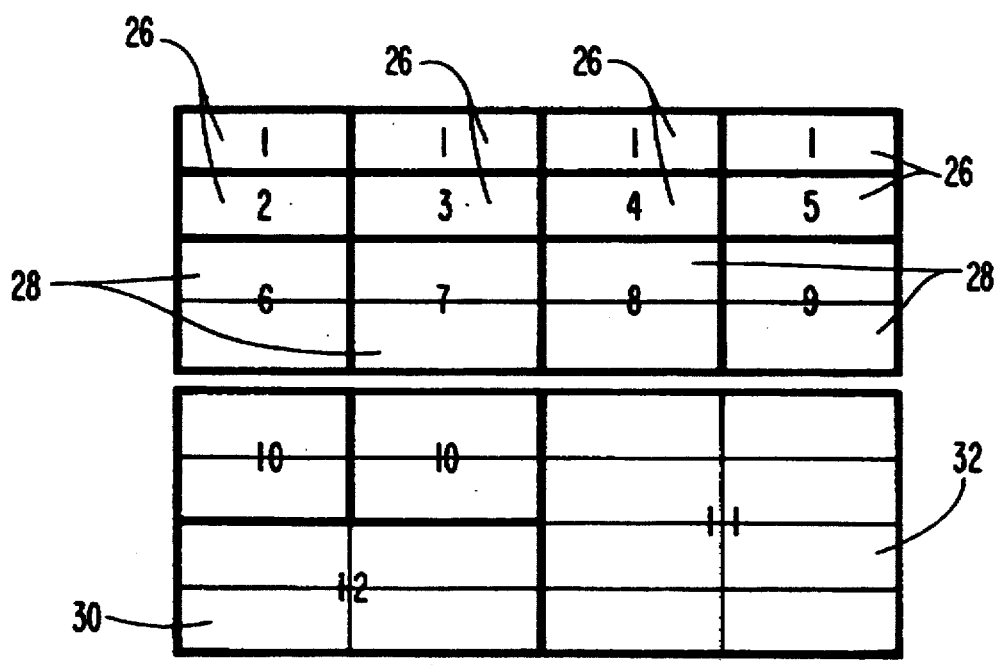
FIG. 3, is a simplified top view of an embodiment of a customi d single frame of the present invention.

In order to implement many different designs on one wafer, it is desirable to have the ability to handle designs with different gate counts. The base array 24 is the building block for each individual customized integrated circuit that will result when using the present invention. FIG. 3 shows an example of how the architecture of the present invention uses base arrays 24 to produce integrated circuits with various gate counts. In the embodiment shown in FIG. 3, a frame 20 comprising thirty-two base arrays 24 is divided in order to produce sixteen different integrated circuits. Eight base arrays 24 are used to create eight customized single base array integrated circuits 26. Each of the eight customized single base array integrated circuits 26 can be of different designs, the same designs, or combinations of the same designs. In addition to the customized single base array integrated circuits 26, twelve base arrays 24 are used to create six customized dual base array integrated circuits 28. Four base arrays 24 are used to create a one customized quad base array integrated circuit 30. Finally, eight base arrays 24 are used to create a one customized eight base array integrated circuit 32. Hence, it can be seen that with a frame 20 comprised of thirty-two base arrays 24, many different combinations of custom integrated circuits can be fabricated within one frame 20.

The shape of the base array 24 is very important because the resulting custom integrated circuit must be able to fit within industry standard integrated circuit packages, for example flat pack packages, pin grid arrays and leadless chip carriers. Because the custom integrated circuits can be formed of one, two, four and more base arrays 24, the dimensions of the basic array is important. The dimensions of base array 24 must be such that when the customized integrated circuits are fabricated, they must fit within industry standard packages regardless of how many base arrays 24 are used. In the preferred embodiment, the basic array 24 has dimensions of approximately 0.115 inches by 0.074 inches.

In one preferred embodiment of the present invention, which is described in more detail below, it is possible to have integrated circuits constructed of from one to thirty-two base arrays 24. However, it is possible to use the teachings of the present invention to create integrated circuits using many different numbers of base arrays 24.

Figure 4:
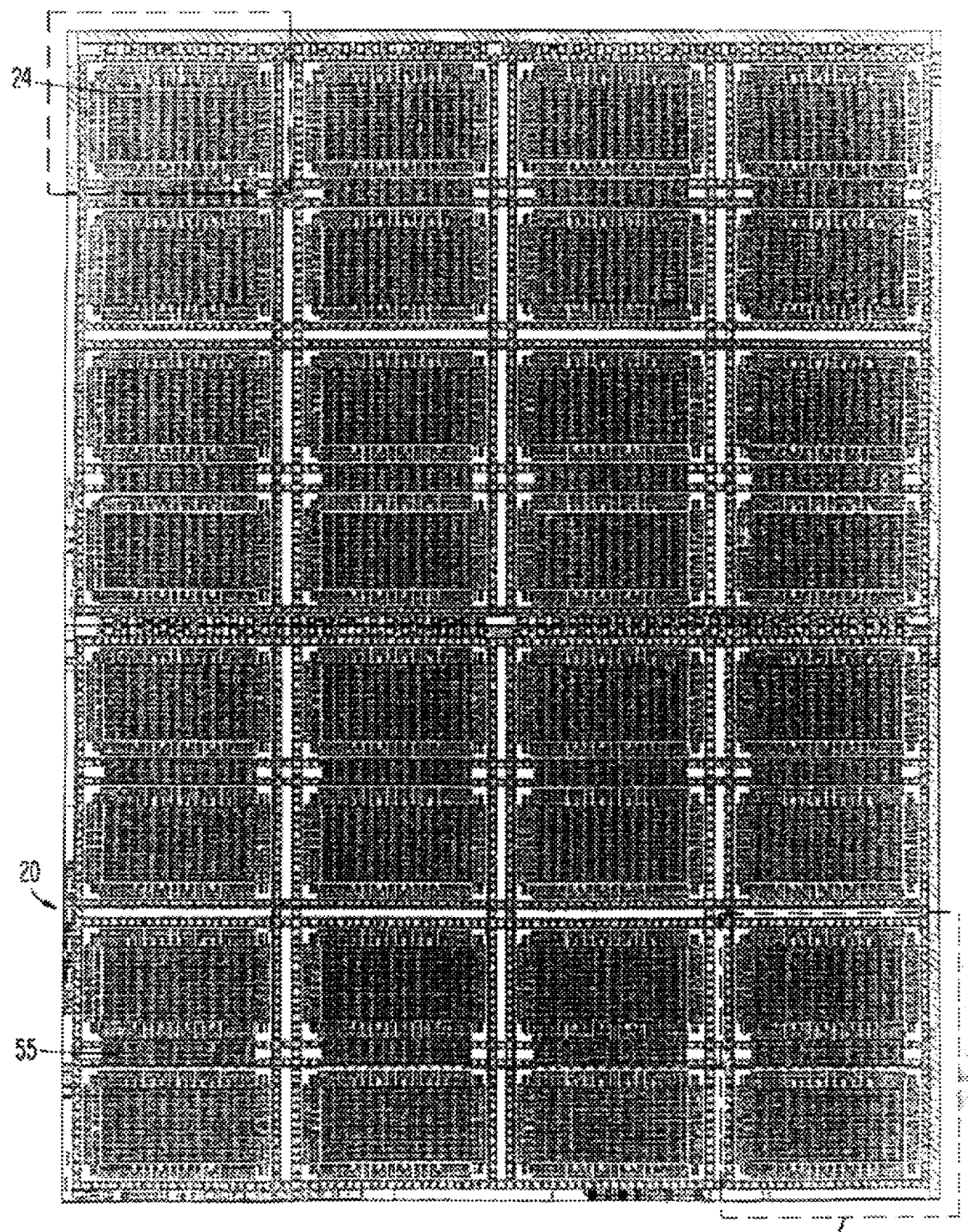
FIG. 4 is a plot of the generic layers of an embodiment of one frame of the present invention.
Figure 5:
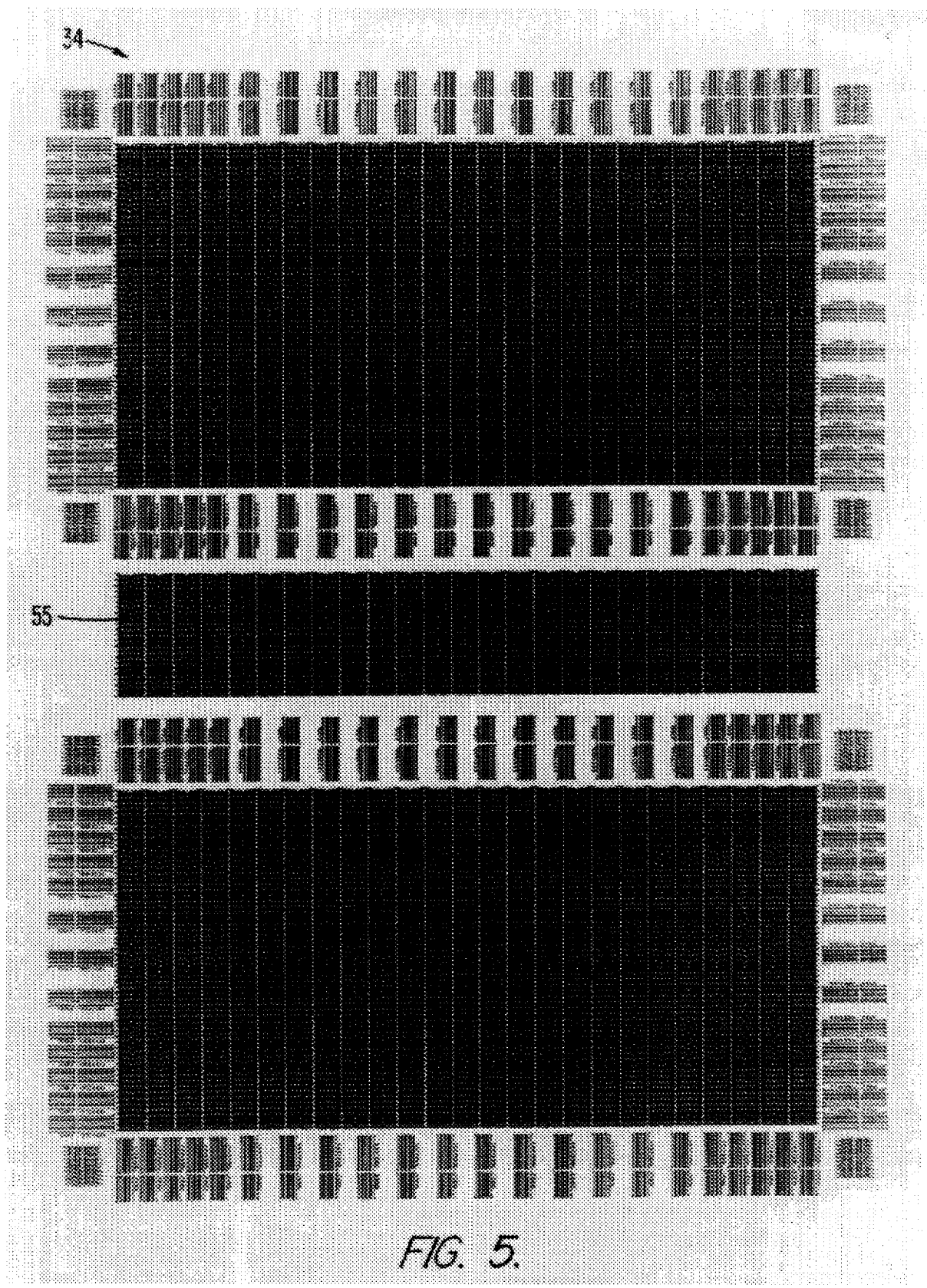
FIG. 5 is an enlarged view of the generic layers of an embodiment of one iterative frame building block of the frame shown in FIG. 4.
Figure 6:
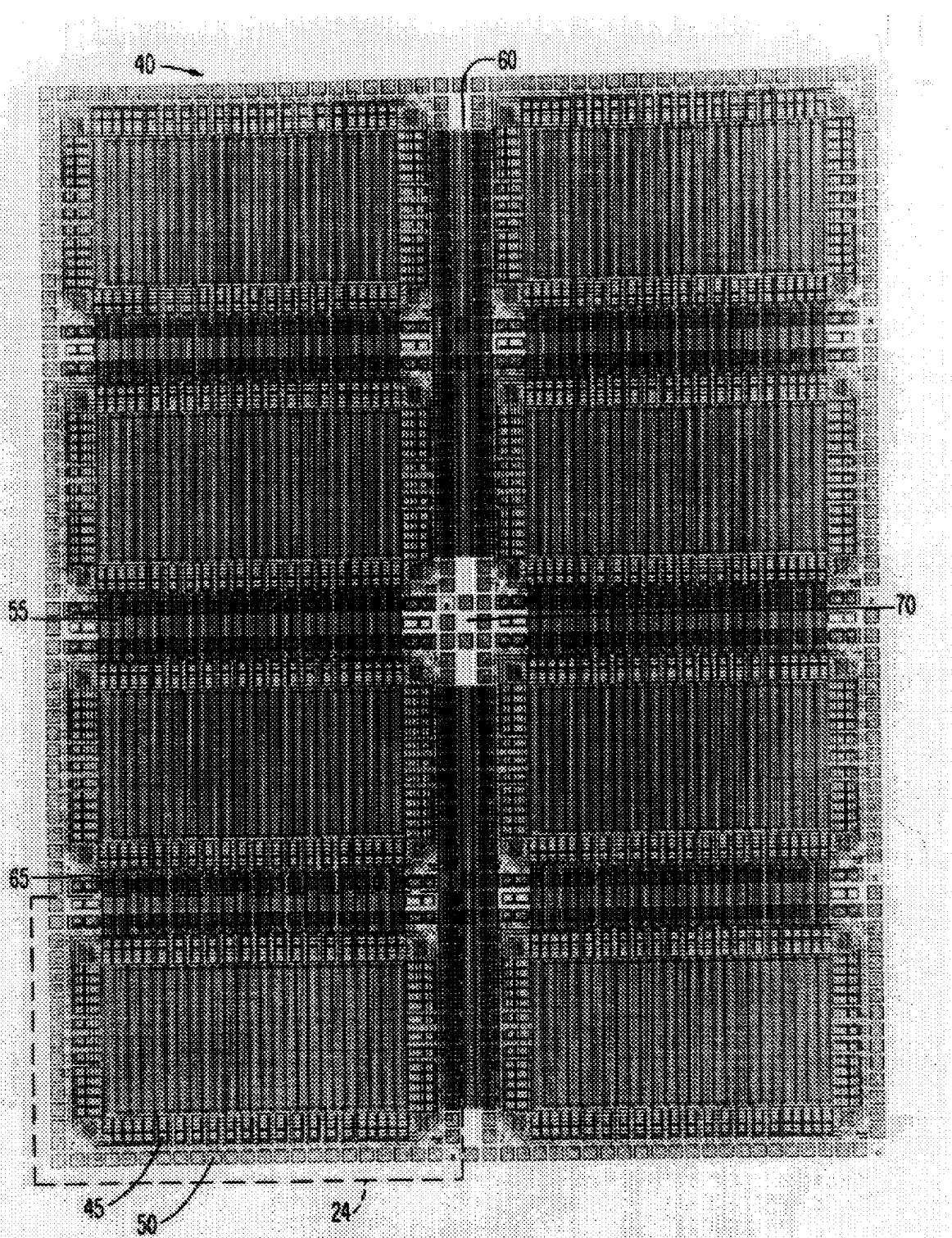
FIG. 6 shows an alternative embodiment of an iterative frame building block of the present invention.

FIG. 4 shows a composite plot of the generic layers of a frame 20. Each frame 20 is comprised of an array of iterative frame building blocks. In the embodiment shown in FIG. 4, the frame building block 34 is comprised of two base arrays 24. An enlarged view of the generic layers of the frame building block 34 is shown in FIG. 5. The frame building block 34 shown in FIGS. 4 and 5 only represents one embodiment of a frame building block. It is possible to have a frame building block comprised of any number of base arrays 24. For example, FIG. 6 shows a frame building block 40 containing eight base arrays 24.

Figure 7:
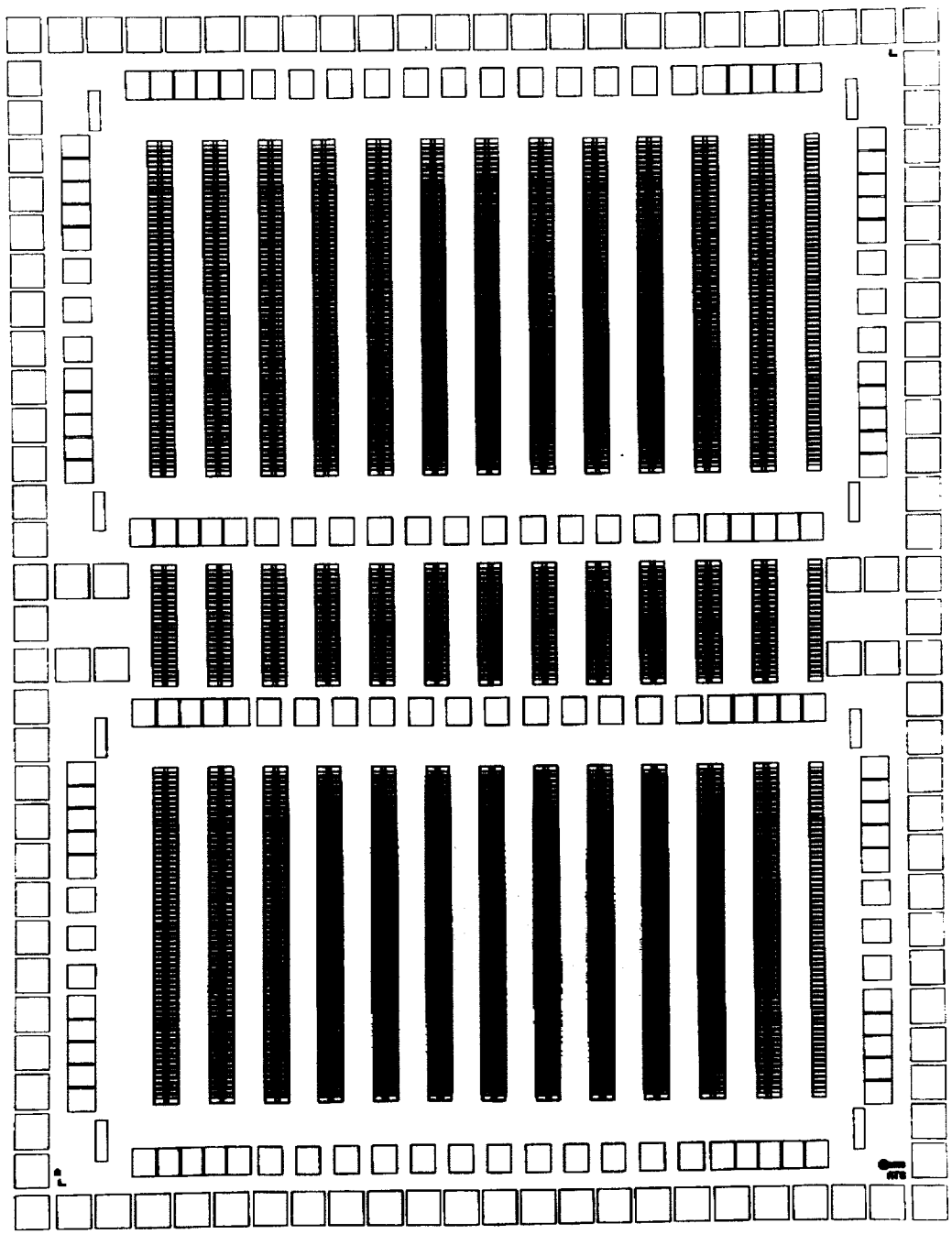
FIG. 7 shows an embodiment of a P-well mask for one embodiment of a frame building block of the present invention.
Figure 8:
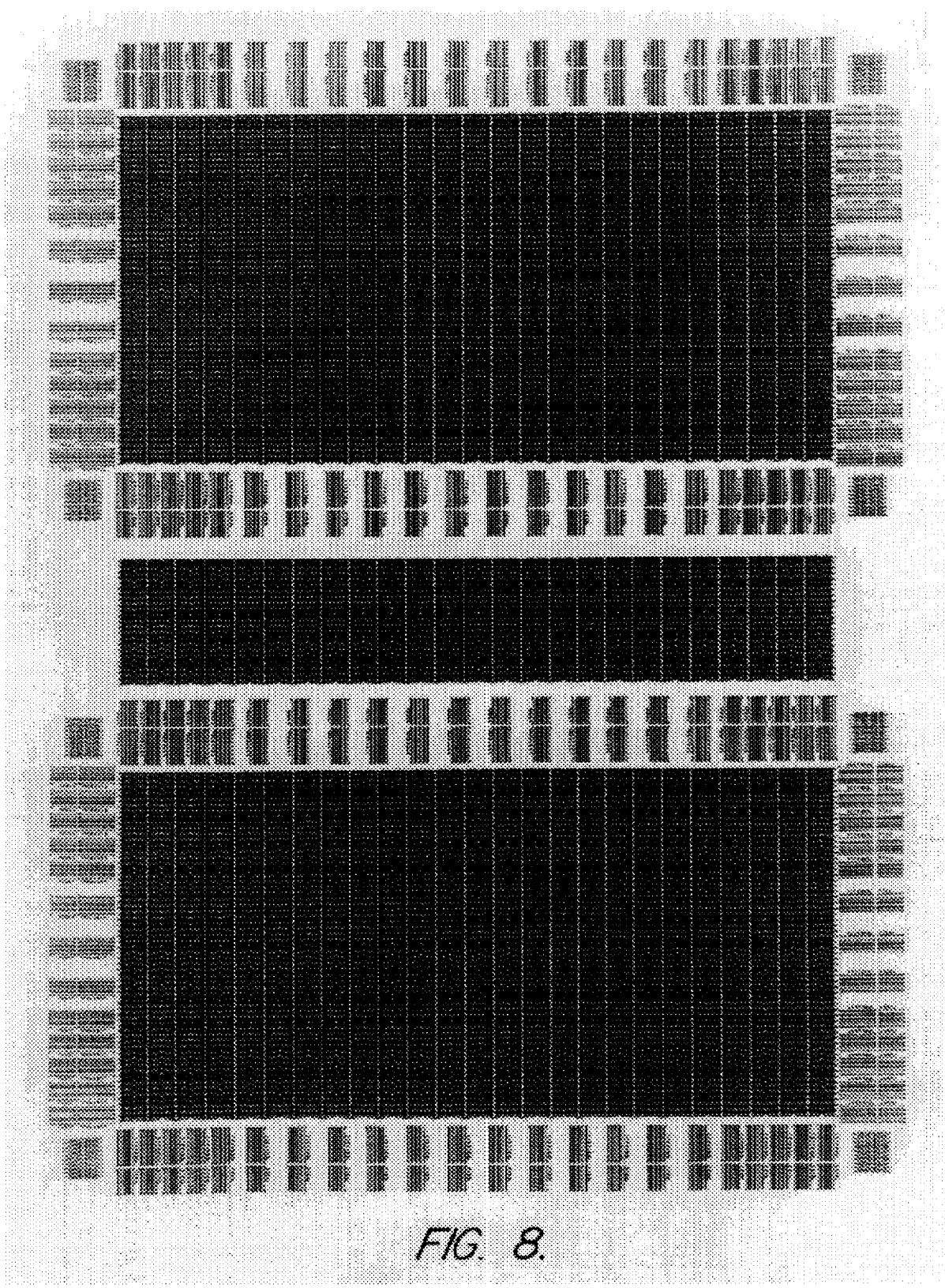
FIG. 8 shows an embodiment of the gate polysilicon mask for an embodiment of a frame building block of the present invention.
Figure 9:
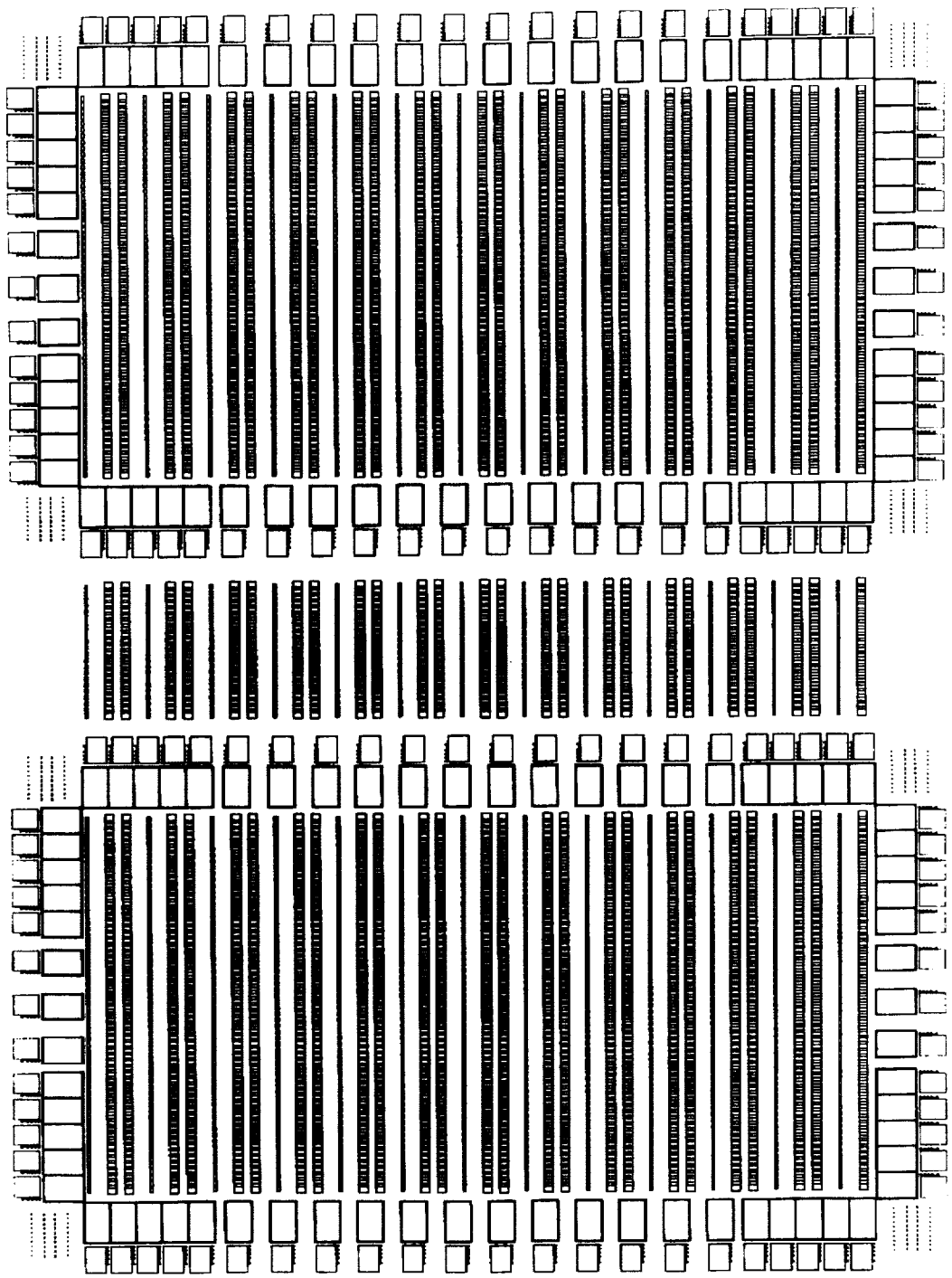
FIG. 9 shows an embodiment of the N-channel source-drain mask for an embodiment of a frame building block of the present invention.
Figure 10:
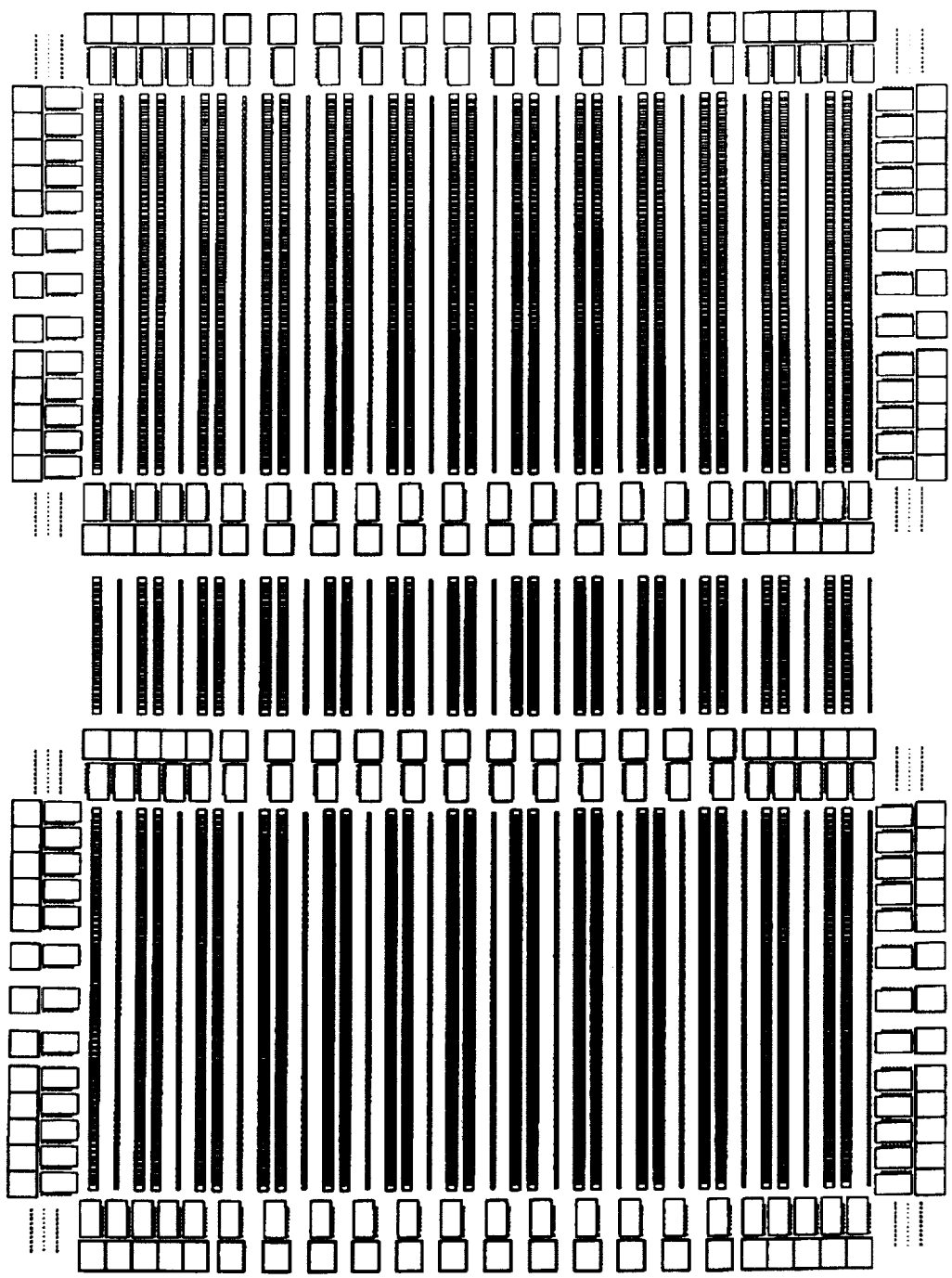
FIG. 10 shows an embodiment of the P-channel source-drain mask for an embodiment of a frame building block of the present invention.

The generic layers of frame 20 are preferably fabricated using a ten mask process. In the presently preferred process, the first step is the P-well mask. An embodiment of a section of a P-well mask for a frame building block 34 of the present invention is shown in FIG. 7. The second fabrication step is the LOGICAL OR of the N-channel source drain and the P-channel source-drain. The third step is the N-channel field mask, which is made from the same data as the P-well mask. The fourth step is the N-channel punch-through mask, which is also made from the same data as the P-well mask. The fifth step is the Gate polysilicon mask. The gate polysilicon mask is shown in FIG. 8. The sixth step is the lightly doped drain mask which is made from the same data as the N-channel source-drain mask. The seventh step is the N-channel source-drain mask. The N-channel source-drain mask is shown in FIG. 9. The eighth step is the P-channel source-drain mask. The P-channel source-drain mask of frame building block 34 is shown in FIG. 10. At this stage of the manufacturing process, the wafers are then set aside until they are ready for personalization.

Figure 11:
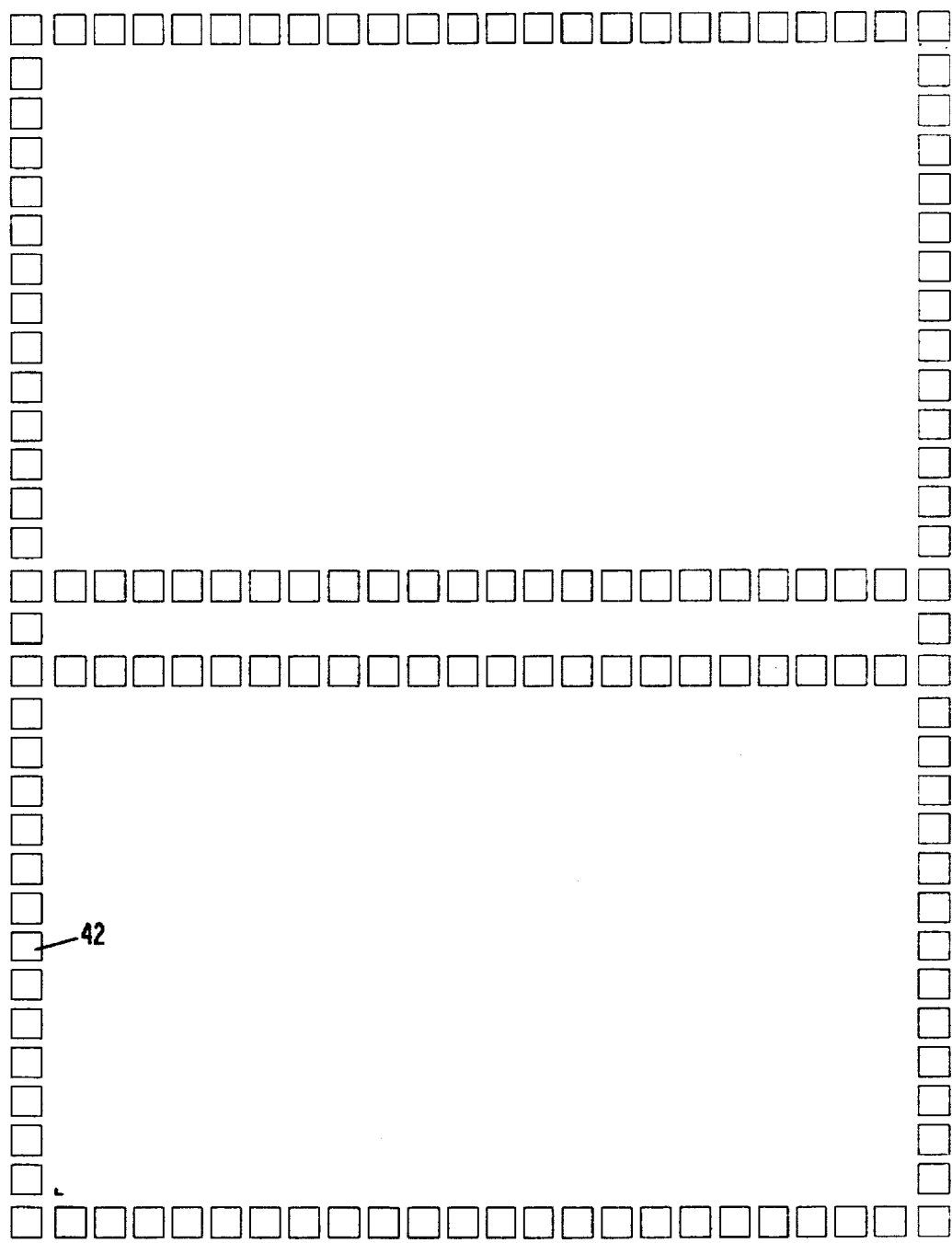
FIG. 11 shows an embodiment of the bond pad opening mask for an embodiment of a frame building block of the present invention.

The personalization layers of frame 20 are preferably fabricated using a four mask process. In the presently preferred personalization process, the first step is the contact mask. After the contact mask step, the ninth generic layer, contact enhancement is fabricated which is made from the same data as the N-channel source-drain. The second personalization step is the first metal mask. The third personalization step is a via mask. The fourth personalization step is the second metal mask. After personalization is complete, the tenth and final generic layer, the passivation, which includes bonding pad openings 42, is fabricated. An embodiment of the passivation mask, including bonding pad openings 42, is shown in FIG. 11.

Figure 12A:
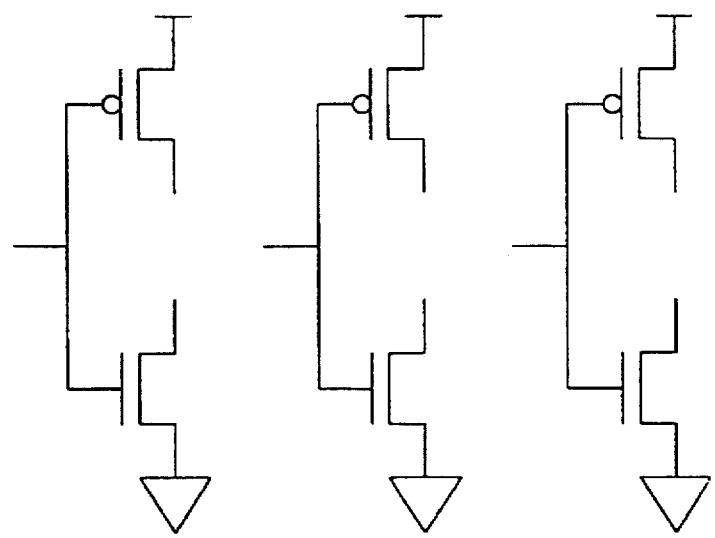
FIG. 12a shows a schematic of the logic block used in an embodiment used in the present invention and shown in FIG. 12.
Figure 12:
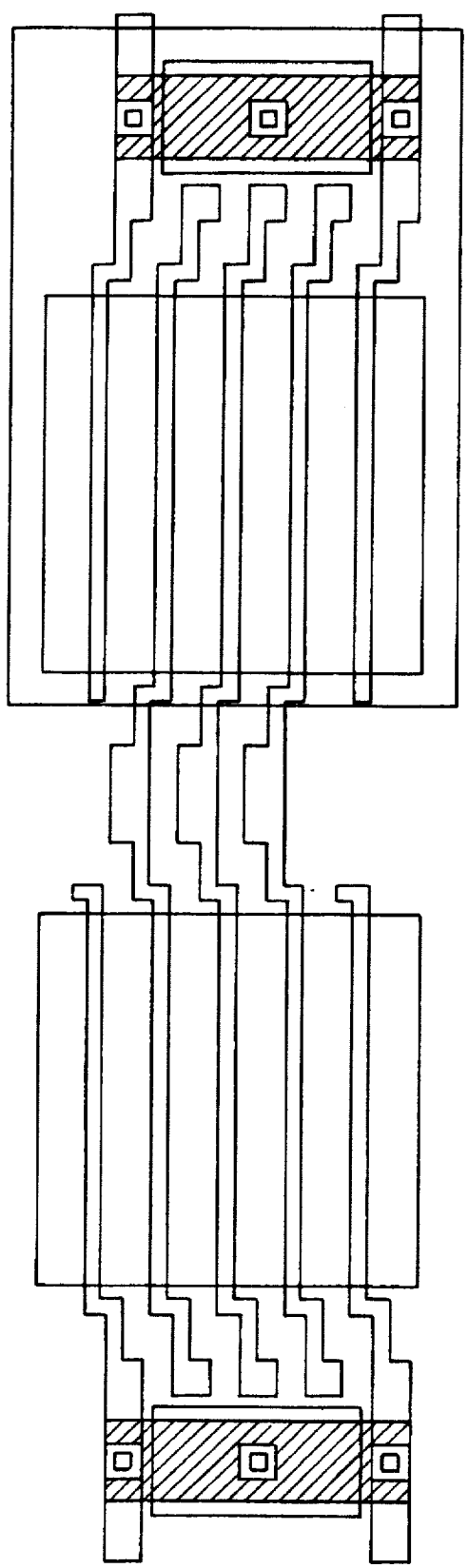
FIG. 12 shows a logic block used in an embodiment used in the present invention.

The architectural details of each frame 20 will now be discussed. The frame building block 40 of FIG. 6 will be used for discussion purposes. However, it should be clear to one skilled in the art that the discussion applies to frames with frame building blocks containing both a greater number and lesser number of base arrays 24 than frame building block 40. As discussed, frame building block 40 is comprised of eight base arrays 24. Each base array 24 is comprised of an array of "sites". Each site, after the personalization layers are fabricated, will form a plurality of basic logic blocks. An example of a site that, after personalization, has become a logic block is shown in FIG. 12. In a preferred embodiment, the logic block has the schematic as shown in FIG. 12a. This logic block comprises three N-type transistors and three P-type transistors whose gate terminals are tied together in pairs. Typically, logic blocks in gate arrays are constructed with one, two or three pairs of transistors. However, the N-type and P-type transistors are frequently connected together. In the various embodiments of the present invention, the gates of the N-type and P-type transistors are tied together in pairs because such an arrangement provides for more efficient routing.

Figure 13:
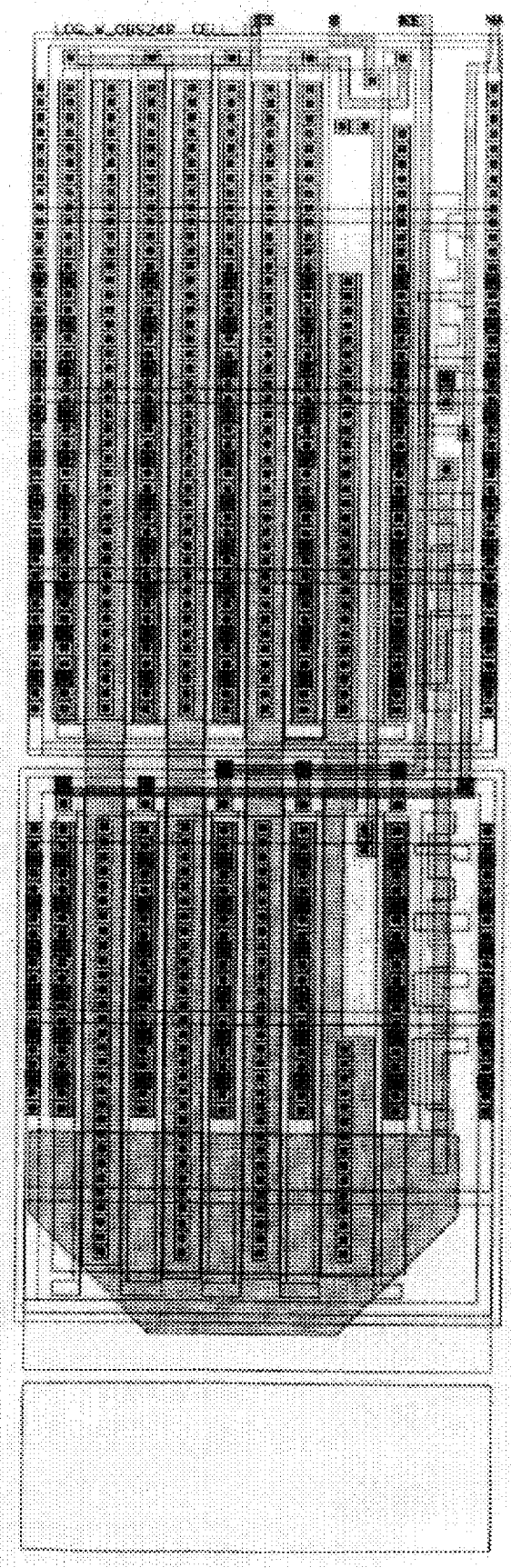
FIG. 13 shows an embodiment of an I/O buffer with a pull up resistor.

Surrounding the sites disposed in the center of the base array 24 are a plurality of input/output ("I/O") buffers 45, often referred to as drivers. An example of a preferred I/O buffer 45 is shown in FIG. 13. The I/O buffer shown has pull-up resistor. However, the I/O buffer 45 can be fabricated with pull-down resistors as well, depending on the user's desired function.

Surrounding the I/O buffers 45 and sites is a ring of bonding pads 50 which may be fabricated. The bonding pads 50 that are fabricated are fabricated during the first metal mask, the via mask and the second metal mask.

In prior art integrated circuit fabrication, the region between base arrays 24 was occupied by scribe channels. In the prior art, the scribe channels often contained test, alignment and process monitoring devices. These devices were used by the integrated circuit foundry during and after fabrication to ensure quality and functionality of the fabricated integrated circuit. However, since the scribe channel was always cut though when forming the individual integrated circuits, the devices in the scribe channel were always discarded. In the present invention, however, the scribe channel is occupied by bridging circuitry. In the frame building block 40 shown in FIG. 6, bridging circuitry is fabricated in two fashions. Firstly, single-cell bridging circuitry 55 is fabricated between the latitudinal (long) sides of each adjacent base array 24. Additionally, double-cell bridging circuitry 60 is fabricated to span across the longitudinal (short) sides of two base arrays 24. Note that reference to directions such as "longitudinal" and "latitudinal" may be used with reference to the figure being discussed. It is understood that these convenient directional references are not limiting. The present invention contemplates the use of bridging circuitry in many different fashions. For example, as shown in FIG. 4, bridging circuitry 55 can be fabricated only along the latitudinal direction.

Prior to personalization, bridging circuitry 55, 60 is comprised of sites, just as with the base array 24. After personalization, bridging circuitry 55, 60 is comprised of both logic and interconnect. The usefulness of bridging circuitry 55, 60 will be discussed below.

On the periphery of the frame building block 40, bonding pads 50 are fabricated during the personalization stage, as discussed above. Further, bonding pads 65 can fabricated where bridging circuitry 55, 60 is located when manufacturing integrated circuits that do not utilize the bridging circuitry 55, 60. For example, when fabricating an integrated circuit that only requires a single base array 24, the latitudinal bridging circuitry 55 and longitudinal bridging circuitry 60 will not be used. Instead of fabricating the sites on the bridging circuitry 55, 60 to form logic, bonding pads 50 are fabricated thereon. Further, in the frame building block 40 shown in FIG. 6 where the longitudinal bridging circuitry 60 spans across two base arrays 24, space 70 exists where there is no bridging circuitry. However, bonding pads 50 can be disposed in that space when they are needed.

In a presently preferred architecture, each base array 24 has enough sites located thereon to produce an integrated circuit with approximately two thousand gates. Further, as discussed, the bridging circuitry 55, 60 is also formed of sites. The single-cell, or latitudinal bridging circuitry 55 has enough sites to produce approximately five-hundred gates. Additionally, double-cell, or longitudinal bridging circuitry 60 has enough sites to produce approximately one-thousand gates. Hence, it is possible to manufacture custom integrated circuits with gate counts of approximately two-thousand, four-thousand five hundred and ten-thousand gates if single, dual and quad base array integrated circuits can be constructed.

Figure 14:
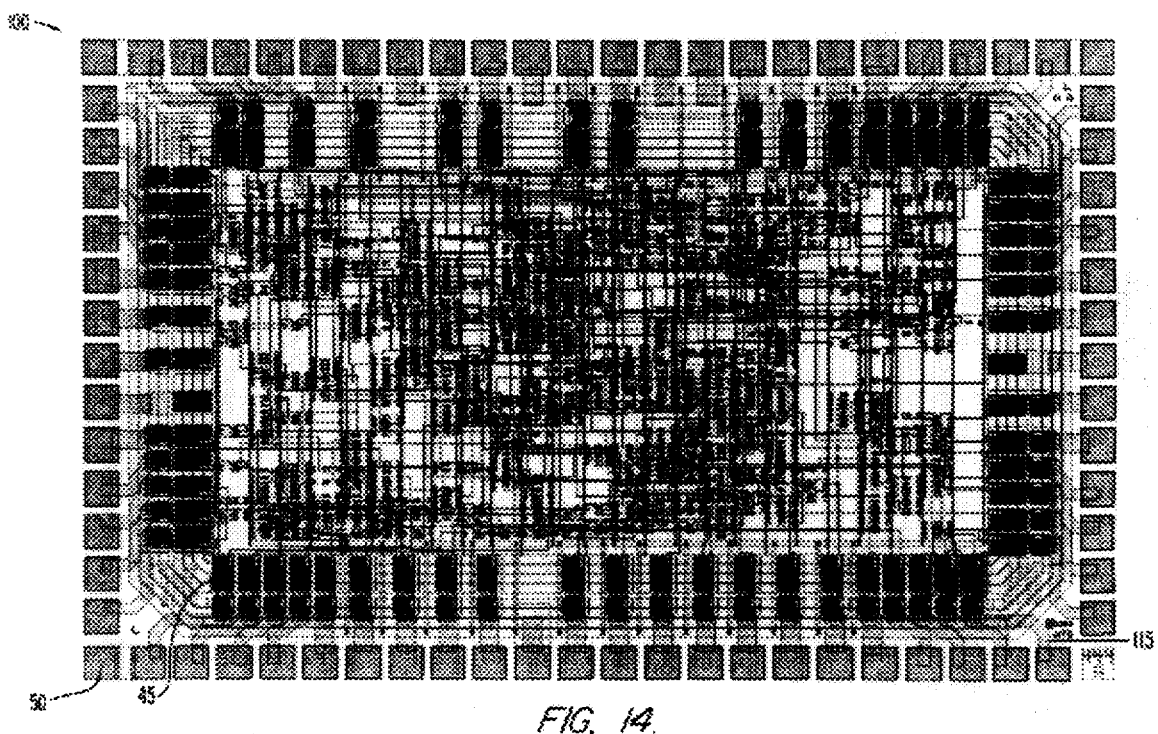
FIG. 14 shows an example of a customized integrated circuit utilizing a single base array of the present invention.
Figure 15:
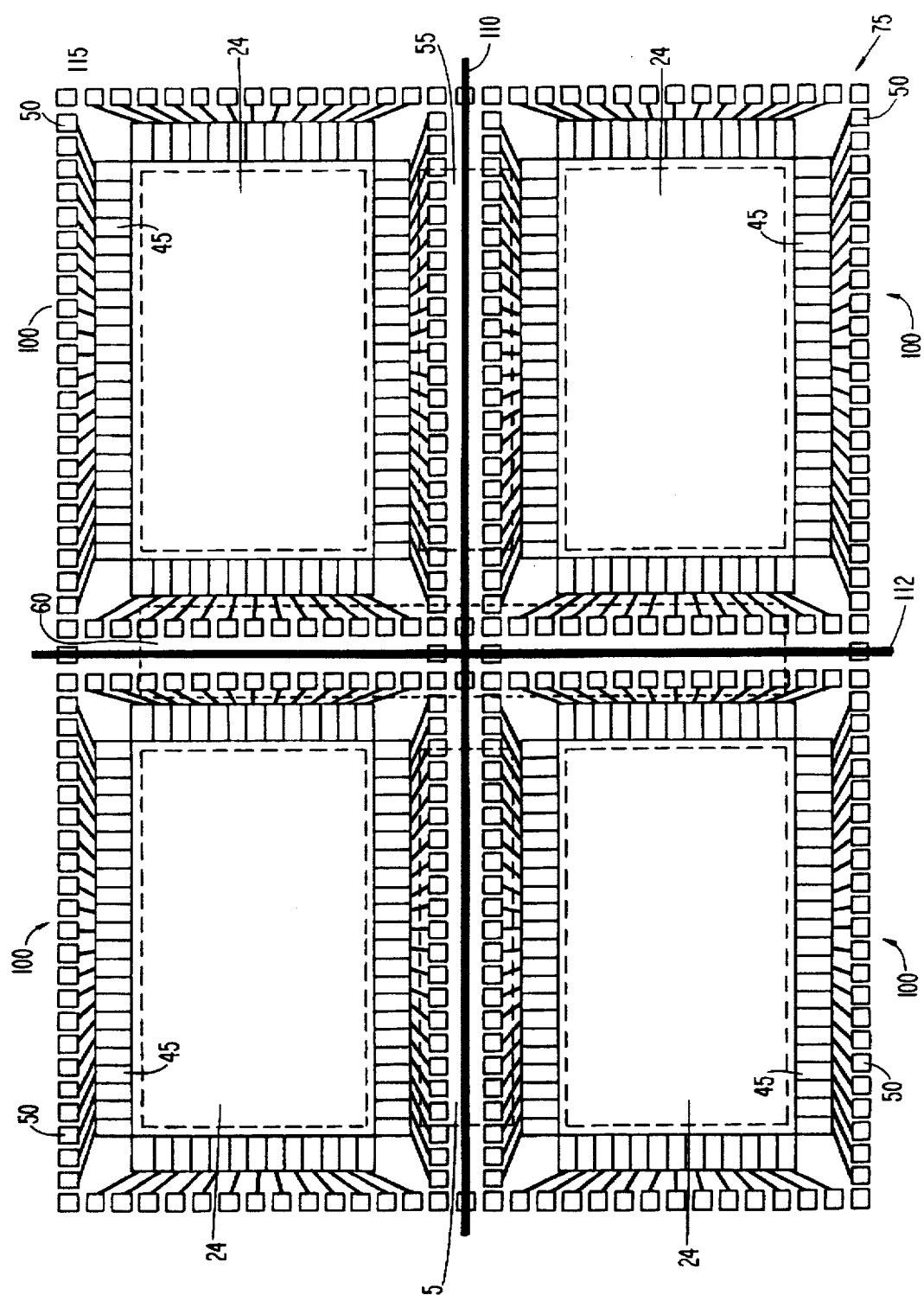
FIG. 15 shows a diagrammatic view of a frame building block comprised of four base arrays that will be used to construct four single base array customized integrated circuits.

The flexibility of the present invention is best understood with reference to several examples. FIG. 14 shows an example of a single base array customized integrated circuit 100 (only the personalization layers are shown). FIG. 15 shows a diagrammatic view of a frame building block 75. The single base array customized integrated circuit 100 is fabricated by customizing the sites within the base array 24, selecting the needed I/O buffers 45 and depositing bonding pads 50 such that they surround the customized sites and I/O buffers 45. In the single base array customized integrated circuit 100, bridging logic 55, 60 disposed within the scribe channel is not used. Instead, after fabrication is complete, the bridging circuitry 55, 60 is sawed through at saw lines 110, 112 to form the individual single base array customized integrated circuits 100 (the sawing process is sometimes referred to as "scribe and break"). FIGS. 13 and 14 also show that I/O buffers 45 are connected to bonding pads 50 via metal traces 115.

Figure 16:
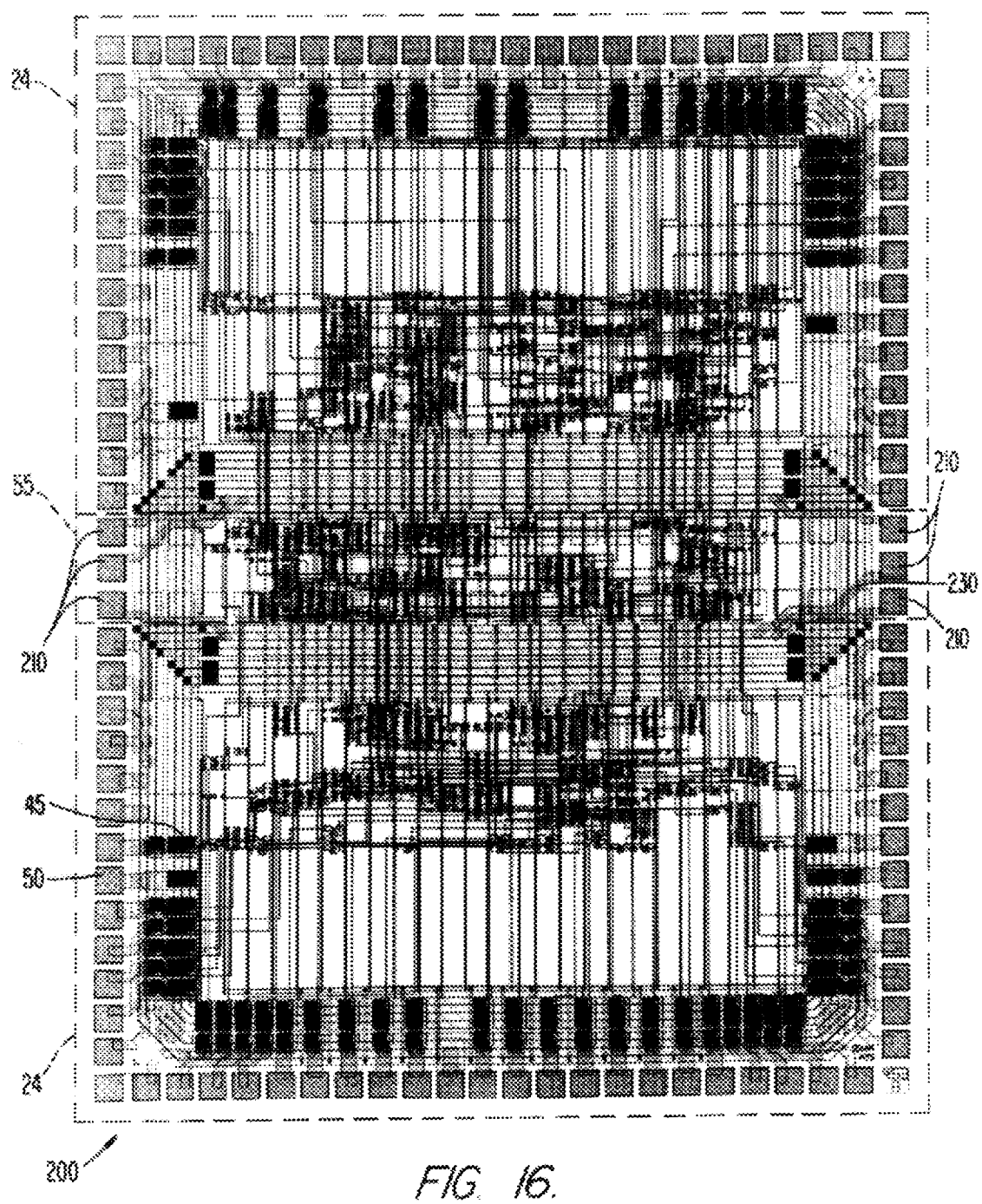
FIG. 16 shows an example of a customized integrated circuit utilizing two base arrays of the present invention.
Figure 17:
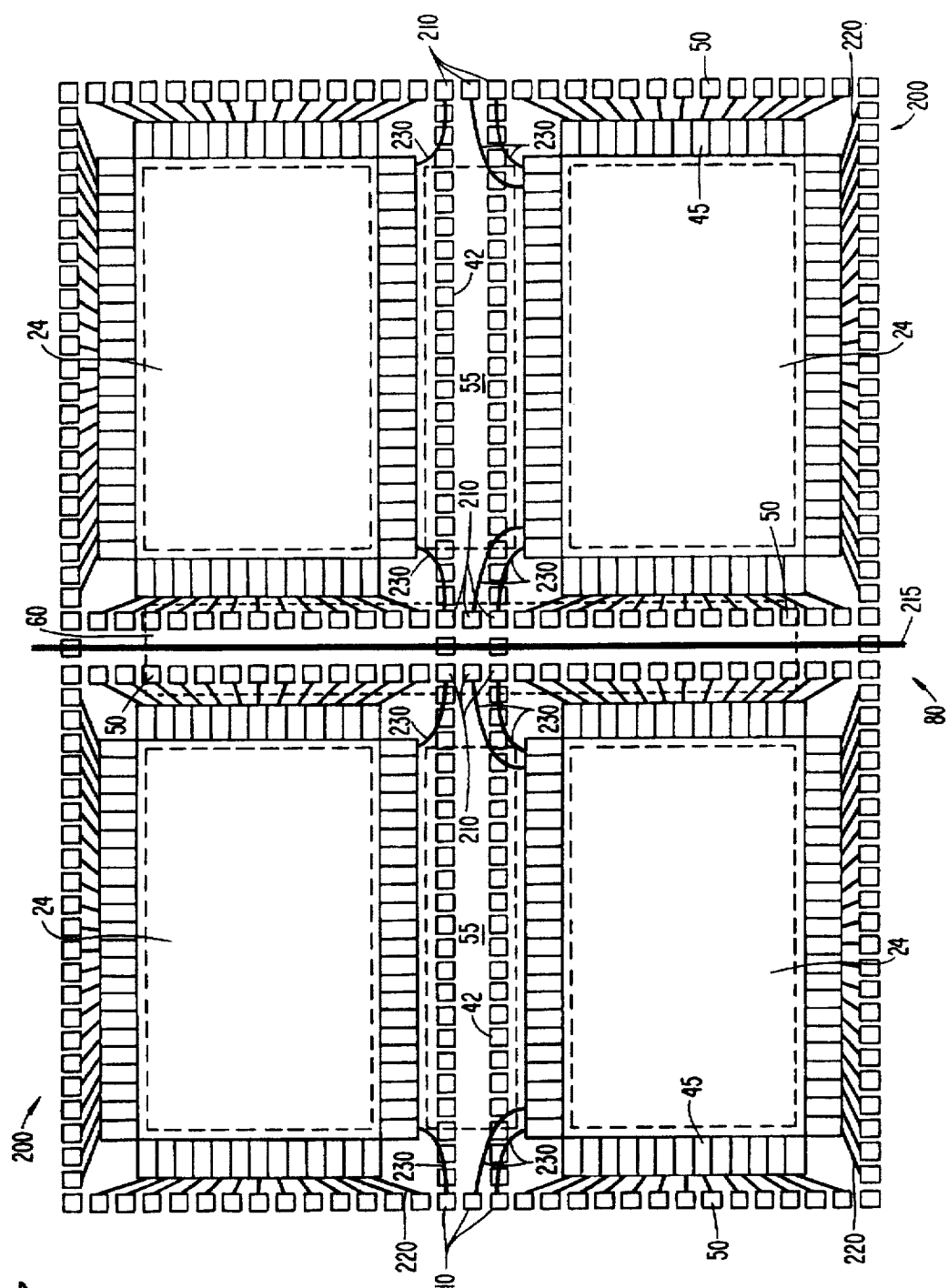
FIG. 17 shows a diagrammatic view of a frame building block comprised of four base arrays that will be used to construct two dual base array customized integrated circuits.

FIG. 16 shows an example of a dual base array customized integrated circuit 200 (only the personalization layers are shown). FIG. 17 shows a diagrammatic view of a frame building block 80. As with the single base array customized integrated circuit 100, the dual base array customized integrated circuit 200 is fabricated by customizing the sites within the base array 24, selecting the needed I/O buffers 45 and depositing bonding pads 50. However, unlike the single base array customized integrated circuit 100, the dual base array customized integrated circuit 200 takes advantage of the single-cell bridging circuitry 55. As is shown in FIG. 17, bridging circuitry 55 is fabricated in the scribe channels between base arrays 24. After fabrication, the bridging circuitry 55 contains both logic and interconnect. The interconnect allows the logic formed in each base array 24 and within the bridging circuitry to electrically communicate with each other. Hence, in addition to increasing the gate density, bridging circuitry 55 allows the gates formed in one base array 24 to communicate with gates in the second base array. Additionally, when the bonding pads 50 are fabricated, they are not fabricated over the bridging circuitry 55. Note that what appear to be bonding pads within the bridging circuitry 55 in both FIGS. 15 and 16 are not metal, but are the bonding pad openings 42 in the passivation. of course, it is possible to make the passivation mask step a personalization mask as well, which would eliminate having bonding pad openings 42 in the passivation where no bonding pads 50 exist. Additionally, as shown in FIGS. 16 and 17, central bonding pads 210 are fabricated on the periphery of the scribe channels where bridging circuitry 55 is fabricated.

In the dual base array customized integrated circuit 200, the double-cell bridging logic 60 (longitudinal) disposed within the scribe channel is not used. Instead, after fabrication is complete, the double-cell bridging circuitry 60 is sawed through at saw line 215 to form the individual dual base array customized integrated circuits 200 (in the embodiment shown in FIG. 17, two individual dual base array customized integrated circuits 200 are formed). FIGS. 16 and 17 also show that I/O buffers 45 are connected to bonding pads 50 via metal traces 220. However, in order to drive central bonding pads 210, spanning metal traces 230 must be used. Spanning metal traces 230 extend from an I/O buffer 45 to the central bonding pads 210. Note that in order to properly implement a custom design, it is not always necessary to utilize every I/O buffer 45 because not every bonding pad 50 or central bonding pad 210 will be used.

Figure 18:
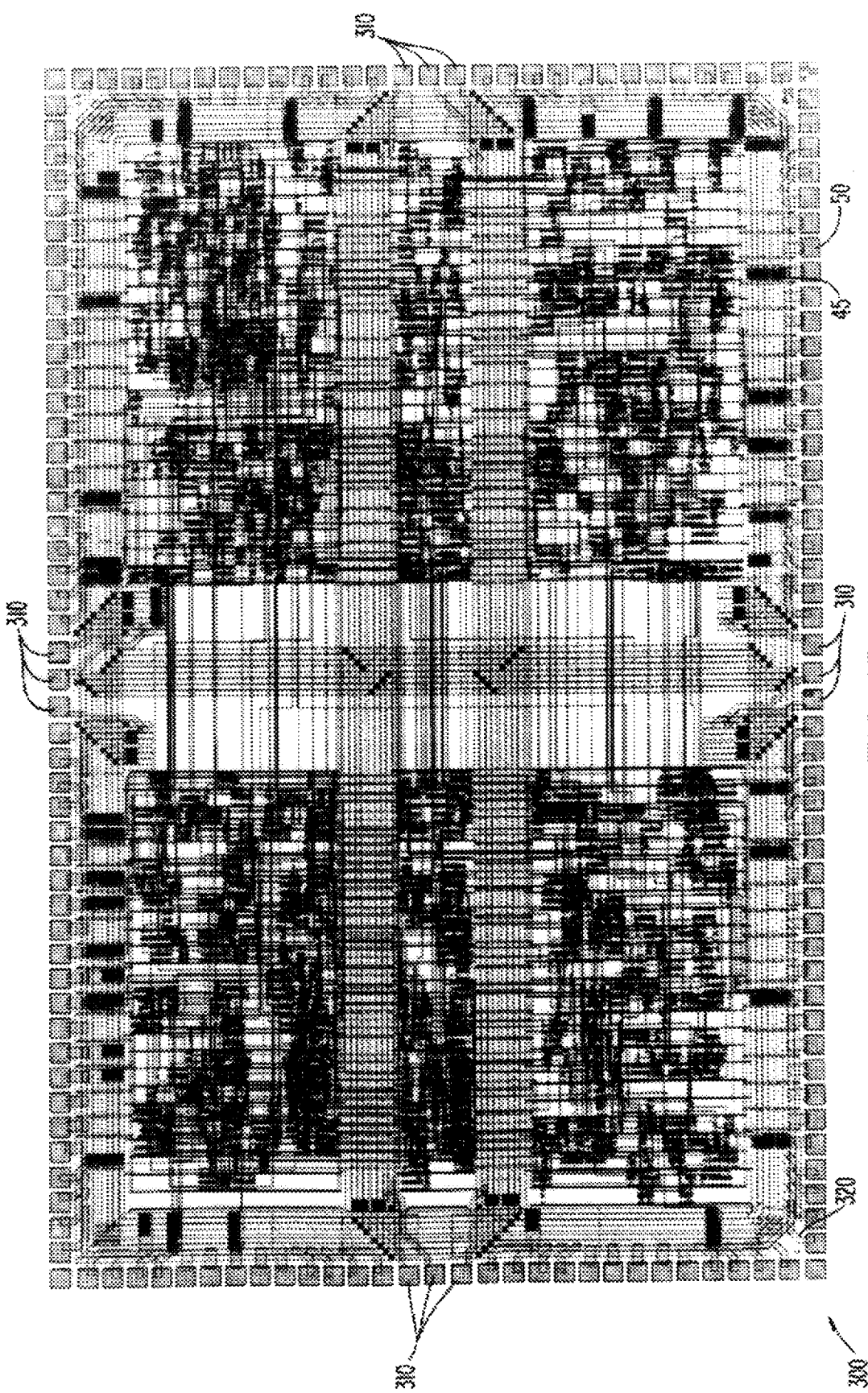
FIG. 18 shows an example of a customized integrated circuit utilizing four base arrays of the present invention.
Figure 19:
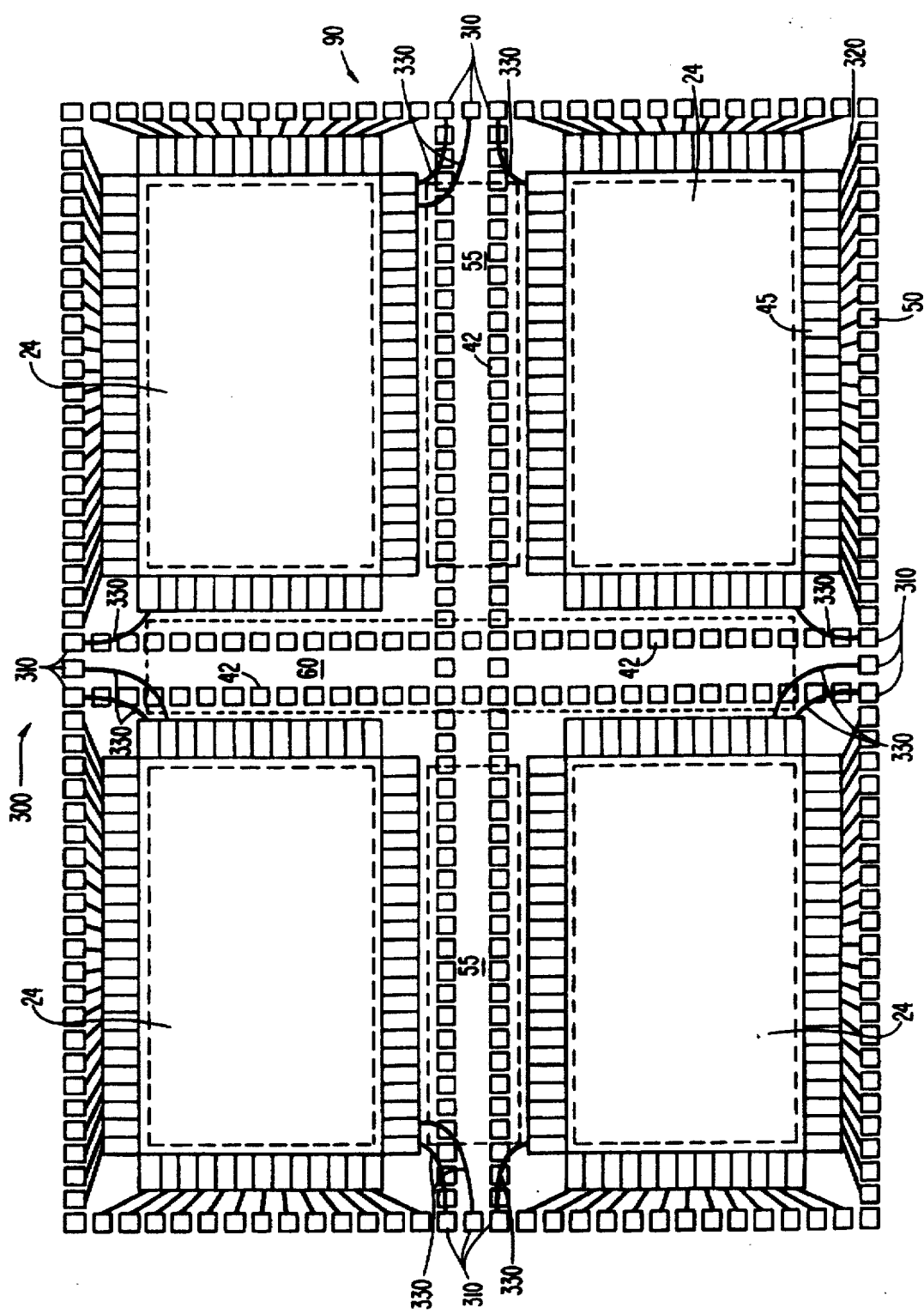
FIG. 19 shows a diagrammatic view of a frame building block comprised of four base arrays that will be used to construct a first embodiment of a quad base array customized integrated circuit.

FIG. 18 shows an example of a quad base array customized integrated circuit 300 (only the personalization layers are shown). FIG. 19 shows a diagrammatic view of a frame building block 90. As with both the single base array customized integrated circuit 100 and dual base array customized integrated circuit 200, the quad base array customized integrated circuit 300 is fabricated by customizing the sites within the base array 24, selecting the needed I/O buffers 45 and depositing bonding pads 50. However, unlike both the single base array customized integrated circuit 100 and the dual base array customized integrated circuit 200, the quad base array customized integrated circuit 300 takes advantage of both the single-cell bridging circuitry 55 (latitudinal) and double-cell bridging circuitry 60 (longitudinal). As is shown in FIG. 19, bridging circuitry 55, 60 can be fabricated in the scribe channels between base arrays 24. After fabrication, the bridging circuitry 55 contains both logic and interconnect. The interconnect allows the logic formed in each base array 24 and within the bridging circuitry to electrically communicate with the logic in the other base arrays 24. Hence, in addition to increasing the logic block density, bridging circuitry 55, 60 allows the logic blocks formed in one base array 24 to communicate with logic blocks formed in the other base arrays 24. Additionally, when the bonding pads 50 are fabricated, they are not fabricated over the bridging circuitry 55, 60. Note that what appear to be bonding pads within the bridging circuitry 55, 60 in both FIGS. 18 and 19 are not metal, but are the bonding pad openings 42 in the passivation. Of course, it is possible to make the passivation mask step a personalization mask as well, which would eliminate having bonding pad openings 42 in the passivation where no bonding pads 50 exist. Additionally, as shown in FIGS. 18 and 19, central bonding pads 310 are fabricated on the periphery of the scribe channels where bridging circuitry 55, 60 are fabricated.

In the quad base array customized integrated circuit 300, both the longitudinal and latitudinal bridging logic 55, 60 are used. Hence, it is not necessary to saw through any of the bridging circuitry 55, 60 located in the scribe channels between the four base arrays 24 used to create the quad base array customized integrated circuit 300. As is clear from this discussion, it is possible to create customized integrated circuits that are larger than the quad base array customized integrated circuit. All that is necessary is to increase the number of base arrays 24 used. For example, when using the embodiment of the frame building block 40 shown in FIG. 6, it is possible to create custom integrated circuits with as many as eight base arrays 24.

FIGS. 18 and 19 also show that I/O buffers 45 are connected to bonding pads 50 via metal traces 320. However, in order to drive central bonding pads 310, spanning metal traces 330 must be used. Spanning metal traces 330 extend from a I/O buffer 45 to central bonding pads 310. In order to properly implement a custom design, it is not always necessary to utilize every I/O buffer 45 because not every bonding pad 50 or central bonding pad 210 will be used.

Figure 20:
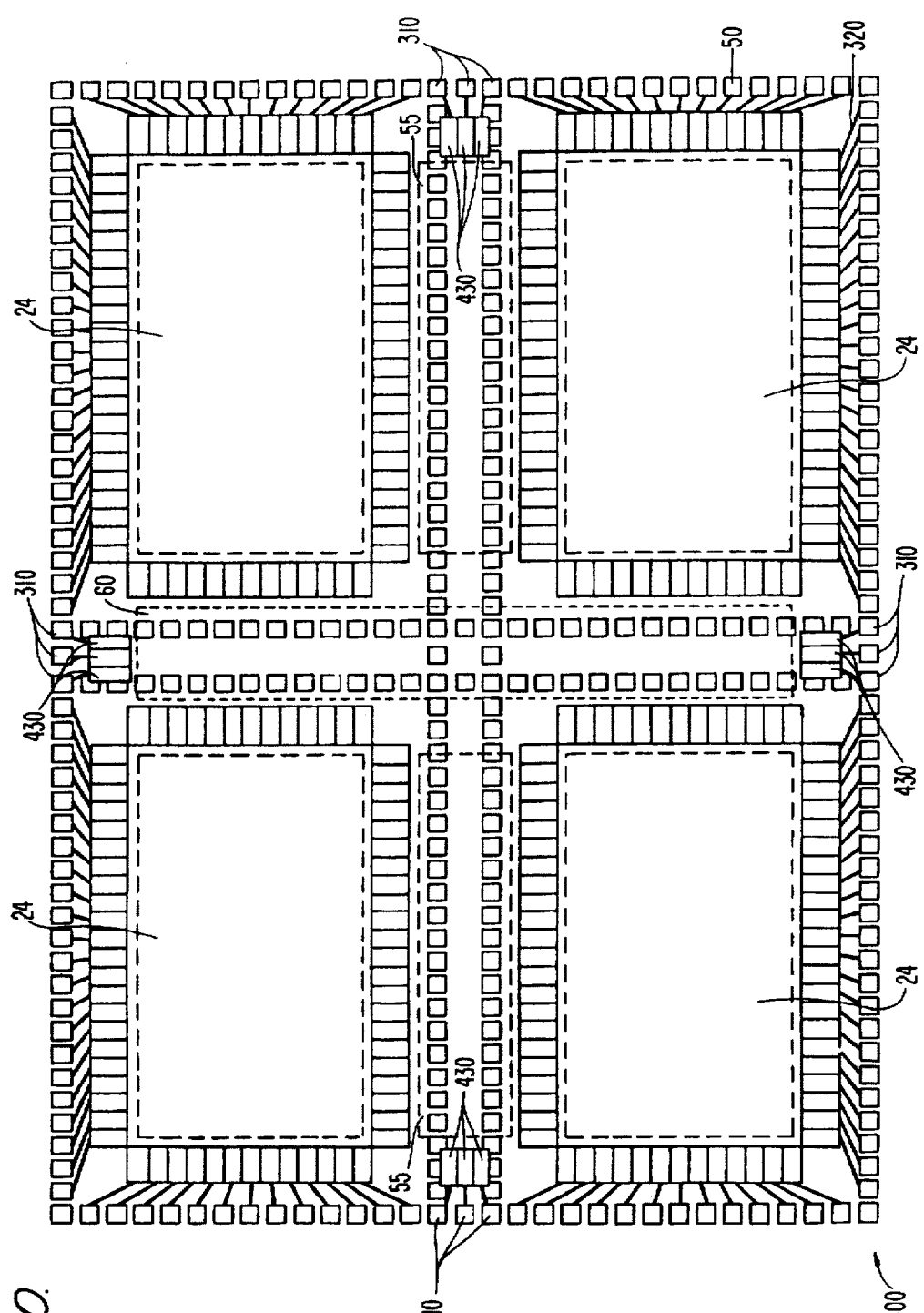
FIG. 20 shows a diagrammatic view of a frame building block comprised of four base arrays that will be used to construct a second embodiment of a quad base array customized integrated circuit.

When connecting I/O buffers 45 to a central bonding pad by spanning metal traces 330, the spanning metal traces 330 must traverse the bridging circuitry 55, 60. Because of this, the use of spanning metal traces 330 reduces the amount of logic and interconnect that can be fabricated from bridging circuitry 55, 60. With reference to FIG. 20, a second embodiment of a quad base array customized integrated circuit 400 is shown. The quad base array customized integrated circuit 400 reduces the problem by fabricating additional I/O buffers 430 adjacent to the central bonding pads 310. The additional I/O buffers 430 allow the use of the same relatively short metal traces 320 used for the other I/O buffer 45 to bonding pad 50 connections. Hence, by fabricating the additional I/O buffers 430, additional logic and interconnect resources of the bridging circuitry 55, 60 can be used, which increases the functionality and flexibility of the resulting quad base array customized integrated circuit 400 when compared to the quad base array customized integrated circuit 300 of FIGS. 18 and 19.

The architecture described above allows for a very efficient method of producing multiple designs on a single wafer, even if the different designs vary widely as to the number of gates or input/output functions. This is because the same basic base array 24 is distributed across the entire wafer 10 and is used for all designs. The use of bridging circuitry further enhances the ability to produce multiple designs on a single wafer because it provides additional gate density and provides for interconnections between the basic arrays 24. By using the iterative basic arrays 24 of the invention, with basic arrays being separated by bridging circuitry 55, 60, the density of a particular customized integrated circuit can be selected by choosing the necessary number of basic arrays 24. Also, the number of base arrays 24 to be utilized need not be decided until the personalization layers are designed. Once the gate density required by a particular custom design is known, the personalization layers are designed using only the number of base arrays 24 necessary for implementation. Because only the number of base arrays 24 necessary for a particular design are used, and because the same base array 24 is located throughout the entire wafer 10, many different designs may be fabricated on a single wafer 10.

Figure 21:
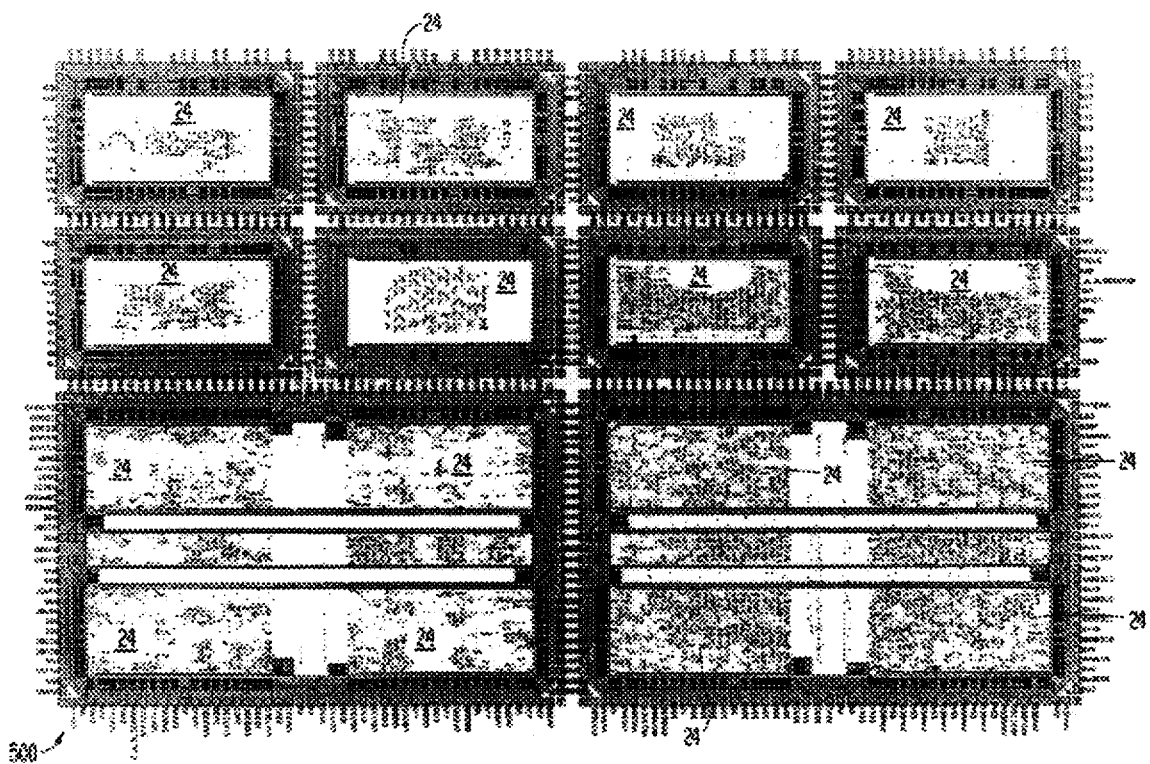
FIG. 21 shows an example of a reticle used to fabricate one personalization layer of several different integrated circuits using the methods of the present invention.
Figure 22:
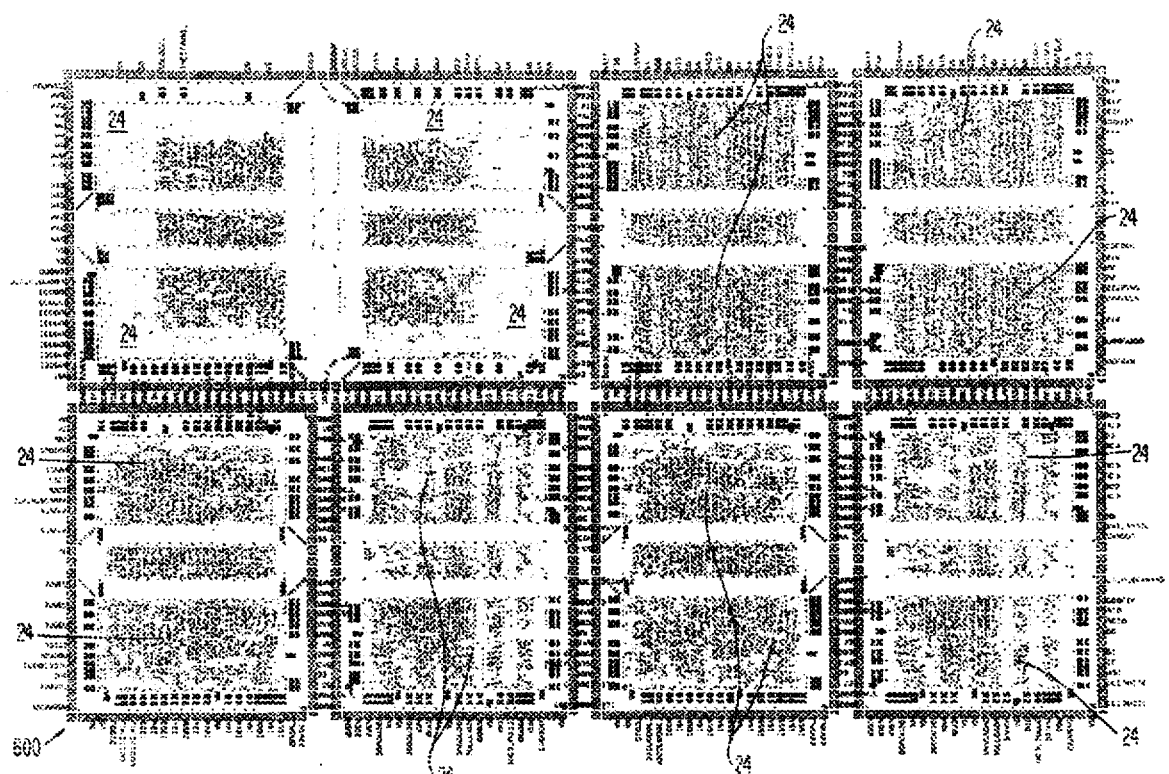
FIG. 22 shows additional an example of a reticle used to fabricate one personalization layer of several different integrated circuits using the methods of the present invention.

FIGS. 20 and 21 provide an example of the efficiency and flexibility provided by the present invention. FIGS. 20 and 21 show examples of a first reticle 500 and a second reticle 600. The reticle 500 shown in FIG. 21 is used to fabricate one layer of ten completely different integrated circuit designs. The designs utilize eight basic arrays 24 to implement eight different single base array customized integrated circuits and eight base arrays 24 to implement two different dual base array custom integrated circuits. The reticle 600 shown in FIG. 22 is used to fabricate one layer of seven completely different integrated circuit designs. The designs utilize twelve basic arrays 24 to implement six different dual base array custom integrated circuits and four base arrays 24 to implement a single quad base array custom integrated circuit.

Adding to the flexibility and efficiency provided by the present invention is the fact that it is possible to step one reticle, for example reticle 500, across a portion of the wafer 10, and then switch from the first reticle to a second reticle, for example reticle 600, and step the second reticle across the remainder of the wafer 10. For example, if both reticle 500 and reticle 600 were used, it would be possible to fabricate seventeen different integrated circuit designs on a single wafer.

It is possible to use the teachings of the present invention by using fabrication techniques other than stepped reticles. For example, instead of using reticles, a mask for each layer having the customized personalization layers for the entire wafer 10 can be used. Additionally, direct-write fabrication techniques can also be used.

Thus, a preferred variable size integrated circuit, mask programmable gate array and method has been described. While embodiments and applications of this invention have been shown and described, as would be apparent to those skilled in the art, many more embodiments and applications are possible without departing from the inventive concepts disclosed herein. The invention, therefore is not to be restricted except in the spirit of the appended claims.

We claim:

1. An semiconductor wafer for constructing customized integrated circuits of various sizes from the wafer comprising:

at least two base arrays fabricated on the wafer, each of said at least two base arrays comprising a plurality of transistors and a plurality of input/output buffers surrounding said plurality of transistors, a first of said at least two base arrays formed adjacent a second of said at least two base arrays, said plurality of transistors adaptable to form logic gates; and bridging circuitry fabricated between each of said at least two base arrays, said bridging circuitry comprising a plurality of transistors which can be adapted to form logic gates or which can be cut through to form at least two discrete integrated circuit dice from said at least two base arrays.

2. The wafer of claim 1 wherein said plurality of transistors of a first of said at least two base arrays are interconnected to one another with metal personalization in order to form a first integrated circuit die.

3. The wafer of claim 2 wherein said plurality transistors of a second of said at least two base arrays are interconnected to one another with metal personalization in order to form a second integrated circuit die.

4. The wafer of claim 2 wherein said plurality of input/output buffers of said first of said at least two base arrays are interconnected with said plurality of transistors of said first of said at least two base arrays.

5. The wafer of claim 3 wherein said plurality of input/output buffers of said second of said at least two base arrays are interconnected with said plurality of transistors of said second of said at least two base arrays.

6. The wafer of claim 1 wherein said plurality of transistors of said bridging circuitry and said plurality of transistors of each of said at least two base arrays are interconnected to one another with metal personalization in order to form a single integrated circuit die comprising said at least two base arrays and said bridging circuitry fabricated between each of said at least two base arrays.

7. The wafer of claim 6 wherein said plurality of input/output buffers of said first and said second of said at least two base arrays at the edge of said single integrated circuit die are interconnected with said plurality of transistors of said first of said at least two base arrays, said plurality of transistors of said second of said at least two base arrays, and said plurality of transistors of said bridging circuitry, said plurality of input/output buffers located between said first and said second of said at least two base arrays not being electrically connected to any circuitry of said single integrated circuit die.

8. A semiconductor wafer for constructing mask programmed integrated circuits of various sizes from the wafer comprising:

a plurality of base arrays fabricated on the wafer, each of said plurality of base arrays comprising a rectangular array of a plurality of discrete circuit elements fabricated thereon;

each of said plurality of base arrays further comprising a first group of input/output buffers at a first edge of said rectangular array, a second group of input/output buffers at a second edge of said rectangular array, a third group of input/output buffers at a third edge of said rectangular array, and a fourth group of input/output buffers at a fourth edge of said rectangular array;

a first of said plurality of base arrays formed adjacent a second of said plurality of base arrays;

bridging circuitry fabricated between said first and said second of said at least two base arrays, said bridging circuitry comprising a plurality of discrete circuit elements, said bridging circuitry adaptable to form logic gates, said bridging circuitry further adaptable to be cut though.

9. The wafer of claim 8 wherein said plurality of discrete circuit elements of a first of said plurality of base arrays are interconnected to one another with metal personalization and wherein said first group, said second group, said third group and said fourth group of input/output buffers of said first of said plurality of base arrays are interconnected with said plurality of transistors of said first of said plurality of base arrays to form a first integrated circuit die.

10. The wafer of claim 9 wherein said plurality discrete circuit elements of a second of said plurality base arrays are interconnected to one another with metal personalization and wherein said first group, said second group, said third group and said fourth group of input/output buffers of said second of said plurality of base arrays are interconnected with said plurality of transistors of said second of said plurality of base arrays to form a second integrated circuit die.

11. The wafer of claim 8 wherein said plurality of discrete circuit elements of said bridging circuitry and said plurality of discrete circuit elements of a first and a second of said plurality of base arrays are interconnected to one another with metal personalization and wherein said first group, said second group and said third group of input/output buffers of said first of said plurality of base arrays and said first group, said second group and said third group of input/output buffers of said second of said plurality of base arrays are interconnected with said plurality of discrete circuit elements of said first of said plurality of base arrays, said plurality of discrete circuit elements of said second of said plurality of base arrays and said plurality of discrete circuit elements of said bridging circuitry to form an integrated circuit die.

12. An semiconductor wafer comprising:

an array of frames fabricated on the wafer, each frame of said array of frames comprising a first base array which can be adapted to implement a single integrated circuit, a second base array which can be adapted to implement a single integrated circuit, a third base array which can be adapted to implement a single integrated circuit and a fourth base array which can be adapted to implement a single integrated circuit, said first base array, said second base array, said third base array and said fourth base array each comprising an array of transistor cells and a plurality of input/output buffers surrounding said array of transistor cells, said transistor cells adaptable to form logic gates;

first bridging circuitry fabricated between said first base array and said second base array and between said third base array and said fourth base array, said first bridging circuitry comprising an array of transistor cells which can be adapted to form logic gates and interconnect between said first base array, said second base array, said third base array and said fourth base array;

second bridging circuitry fabricated between said first base array and said third base array, said second bridging circuitry comprising an array of transistor cells which can be adapted to form logic gates and interconnect between said first base array and said third base array;

third bridging circuitry fabricated between said second base array and said fourth base array, said third bridging circuitry comprising an array of transistor cells which can be adapted to form logic gates and interconnect between said second base array and said fourth base array; and each of said array of frames adaptable to implement four individual integrated circuits, said four integrated circuits comprising a first integrated circuit comprising said first base array, a second integrated circuit comprising said second base array, a third integrated circuit comprising said third base array and a fourth integrated circuit comprising said fourth base array, each of said array of frames further adaptable to implement three individual integrated circuits, said three integrated circuits comprising a fifth integrated circuit comprising said first base array, said third base array and said second bridging circuitry, a sixth integrated circuit comprising said second base array, and a seventh integrated circuit comprising said fourth base array, each array of frames further adaptable to implement a single integrated circuit, said single integrated circuit comprising an eighth integrated circuit comprising said first base array, said second base array, said third base array, said fourth base array, said first bridging circuitry, said second bridging circuitry and said third bridging circuitry.

13. The integrated circuit wafer of claim 12 further comprising:

a first additional input/output buffer disposed adjacent said first bridging circuitry and at a first edge of each frame of said array of frames;

a second additional input/output buffer disposed adjacent said second bridging circuitry and at a second edge of each frame of said array of frames;

a third additional input/output buffer disposed adjacent said first bridging circuitry and at a third edge of each frame of said array of frames; and a fourth additional input/output buffer disposed adjacent said third bridging circuitry and at a fourth edge of each frame of said array of frames.

14. An semiconductor wafer comprising:

an iterative array of frames fabricated on the wafer, each frame of said iterative array of frames comprising N base arrays wherein N is any integer multiple of two, each of said N base arrays adaptable to implement a single integrated circuit, each of said N base arrays adjacent a separate one of said N base arrays, each of said N base arrays comprising a plurality of sites, each of said plurality of sites comprising at least two transistors, each of said base arrays further comprising a plurality of input/output buffers surrounding said plurality of sites; and bridging circuitry fabricated between said N base arrays, said bridging circuitry comprising an array of transistor cells adaptable to form logic gates and interconnect between said N base arrays.

15. The semiconductor wafer of claim 14 wherein each of said plurality of sites comprises an N-type transistor and a P-type transistor wherein gate terminals from each of said N-type transistor and said P-type transistor are tied together.

16. A wafer comprising:

an array of base arrays fabricated on the wafer;

each of said base arrays comprised of a plurality of transistors and a plurality of input/output buffers, said plurality of input/output buffers arranged in a substantially rectangular pattern around the plurality of transistors;

bridging circuitry fabricated between a plurality of said base arrays said bridging circuitry comprising a plurality of transistors adaptable to form logic gates when interconnected together;

a plurality of integrated circuits of various sizes formed on said wafer comprising a multiple number of said base arrays;

a first size of said plurality of integrated circuits comprising two base arrays and said bridging circuitry between said two base arrays, said bridging circuitry between said two base arrays interconnecting a plurality of said transistors in said first one of said two base arrays and said second one of said two base arrays and said input/output buffers of first one and said second one of said two base arrays with the exception of said input/output buffers between said two base arrays; and a second size of said plurality of integrated circuits comprising a single base array fabricated adjacent said first size of said plurality of integrated circuits, said bridging circuitry between said first size and said second size not connected to any of said plurality of transistors or said plurality of input/output buffers.

* * * * *